(12) United States Patent
Kim et al.

(10) Patent No.: US 9,754,789 B2
(45) Date of Patent: Sep. 5, 2017

(54) METHOD OF FABRICATING SEMICONDUCTOR DEVICE AND COMPUTING SYSTEM FOR IMPLEMENTING THE METHOD

(71) Applicants: Yoon-Hae Kim, Suwon-si (KR);
Jong-Shik Yoon, Yongin-si (KR);
Hwa-Sung Rhee, Seongnam-si (KR);
Byung-Sung Kim, Suwon-si (KR)

(72) Inventors: Yoon-Hae Kim, Suwon-si (KR);
Jong-Shik Yoon, Yongin-si (KR);
Hwa-Sung Rhee, Seongnam-si (KR);
Byung-Sung Kim, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 236 days.

(21) Appl. No.: 14/509,316

(22) Filed: Oct. 8, 2014

(65) Prior Publication Data
US 2015/0111381 A1   Apr. 23, 2015

Related U.S. Application Data

(60) Provisional application No. 61/893,401, filed on Oct. 21, 2013.

(30) Foreign Application Priority Data

Jul. 23, 2014 (KR) .................. 10-2014-0093287

(51) Int. Cl.
*H01L 21/44* (2006.01)
*H01L 21/283* (2006.01)
(Continued)

(52) U.S. Cl.
CPC ........ *H01L 21/283* (2013.01); *H01L 21/0337* (2013.01); *H01L 21/31144* (2013.01); *H01L 21/76816* (2013.01); *H01L 21/76897* (2013.01)

(58) Field of Classification Search
None
See application file for complete search history.

(56) References Cited

U.S. PATENT DOCUMENTS 7,794,920 B2   9/2010  Choi
8,359,556 B1   1/2013  Abou Ghaida et al.
(Continued)

FOREIGN PATENT DOCUMENTS

KR   20090019144 A   2/2009
KR   20090069769 A   7/2009
(Continued)

*Primary Examiner* — Angel Roman
(74) *Attorney, Agent, or Firm* — Harness, Dickey & Pierce, P.L.C.

(57) ABSTRACT

Provided are method of fabricating semiconductor device and computing system for implementing the method. The method of fabricating a semiconductor device includes forming a target layer, forming a first mask on the target layer to expose a first region, subsequently forming a second mask on the target layer to expose a second region separated from the first region in a first direction, subsequently forming a third mask in the exposed first region to divide the first region into a first sub region and a second sub region separated from each other in a second direction intersecting the first direction, and etching the target layer using the first through third masks such that the first and second sub regions and the second region are defined in the target layer.

19 Claims, 40 Drawing Sheets

(51) Int. Cl.
*H01L 21/033* (2006.01)
*H01L 21/311* (2006.01)
*H01L 21/768* (2006.01)

(56) References Cited

U.S. PATENT DOCUMENTS

| | | | |
|---|---|---|---|
| 2008/0136037 A1* | 6/2008 | Arakawa | H01L 21/76826 257/773 |
| 2009/0061362 A1 | 3/2009 | Taoka et al. | |
| 2011/0003254 A1 | 1/2011 | Chang et al. | |
| 2012/0196230 A1 | 8/2012 | Cho et al. | |
| 2012/0210279 A1 | 8/2012 | Hsu et al. | |
| 2012/0216157 A1 | 8/2012 | Luo et al. | |
| 2012/0225551 A1 | 9/2012 | Blatchford | |
| 2013/0003108 A1 | 1/2013 | Agarwal et al. | |
| 2013/0061183 A1 | 3/2013 | Abou Ghaida et al. | |
| 2013/0086536 A1 | 4/2013 | Kim et al. | |
| 2013/0159945 A1 | 6/2013 | Kahng et al. | |
| 2014/0284813 A1* | 9/2014 | Greco | H01L 21/76811 257/774 |

FOREIGN PATENT DOCUMENTS

| | | |
|---|---|---|
| KR | 20090132045 A | 12/2009 |
| KR | 20120129083 A | 11/2012 |

\* cited by examiner

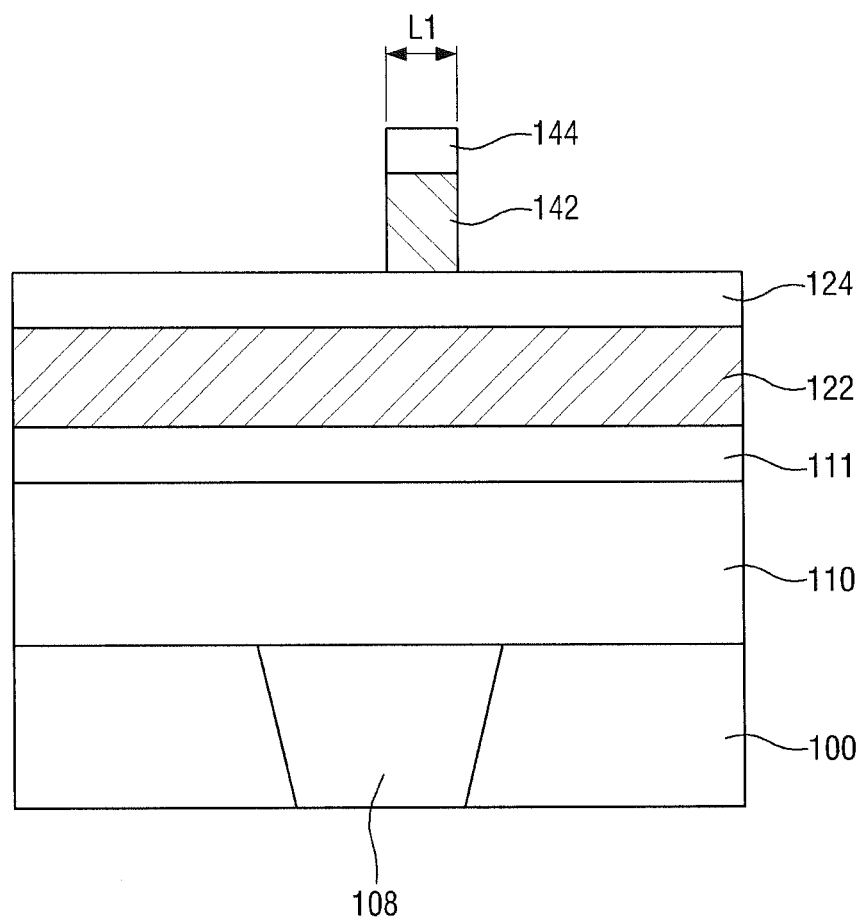

1200

1300

1400

METHOD OF FABRICATING SEMICONDUCTOR DEVICE AND COMPUTING SYSTEM FOR IMPLEMENTING THE METHOD

This application claims priority to U.S. provisional application No. 61/893,401 filed on Oct. 21, 2013 in the USPTO and Korean Patent Application No. 10-2014-0093287 filed on Jul. 23, 2014 in the Korean Intellectual Property Office, the disclosure of each of which is incorporated herein by reference in its entirety.

BACKGROUND

1. Field of the Invention

At least one example embodiment relates to a method of fabricating a semiconductor device and/or a computing system for implementing the method.

2. Description of the Related Art

As semiconductor devices become more highly integrated, a pattern size of the semiconductor device is being rapidly reduced. Accordingly, a process margin for forming fine patterns of a semiconductor device has been reduced. For example, while fabricating a semiconductor device, various patterns including metal wirings are formed using, for example, a photolithography process.

The photolithography process generally consists of a coating process for coating photoresist on an etch target layer, an exposure process for irradiating light to a predetermined (or alternatively, desired portion) of the coated photoresist, and a development process for removing the exposed portion of the photoresist. A desired pattern is formed by etching an etch target layer using a photoresist pattern.

As the integration of semiconductor devices advances, the importance of a fine pattern forming technology also increases. However, because a critical dimension of photoresist that can be implemented by photolithography equipment is limited to a certain range, it becomes more and more difficult to form fine patterns. To address this issue, double patterning lithography has been suggested as a technology to form fine patterns having a line width within the certain range or less.

However, because some patterns are still difficult to pattern even using double patterning lithography, research is being actively conducted on a method of forming such challenging patterns in a reliable manner.

SUMMARY

Some example embodiments provide a method of fabricating a semiconductor device, the method capable of forming fine patterns in a reliable manner.

Some example embodiments also provide a computing system which can implement the above method.

However, example embodiments are not restricted to the example embodiments forth herein. The above and other aspects of example embodiments will become more apparent to one of ordinary skill in the art to which example embodiments pertain by referencing the detailed description of some example embodiments given below.

According to an example embodiment, a method of fabricating a semiconductor device includes forming a target layer, forming a first mask on the target layer to expose a first region, subsequently forming a second mask on the target layer to expose a second region separated from the first region in a first direction, subsequently forming a third mask in the exposed first region to divide the first region into a first sub region and a second sub region separated from each other in a second direction intersecting the first direction, and etching the target layer using the first through third masks such that the first and second sub regions and the second region are defined in the target layer.

According to an example embodiment, a method of fabricating a semiconductor device includes receiving a layout design in which first and second patterns formed using double patterning lithography are defined, the first pattern including a first sub pattern and a second sub pattern separated from the first sub pattern by a first gap, generating a first mask for exposing regions defined as the first and second sub patterns and a region between the first and second sub patterns, generating a second mask for exposing a region defined as the second pattern, and generating a third mask for dividing a region exposed by the first mask into the regions defined as the first and second sub patterns.

According to an example embodiment, a computing system includes a processor configured to execute a mask generating module. When the mask generating module is executed by the processor, the mask generating module configures the processor to receive a layout design and generate masks for forming patterns included in the layout design using the processor. The layout design includes first and second patterns formed using double patterning lithography, the first pattern includes a first sub pattern and a second sub pattern separated from the first sub pattern by a first gap. The mask generating module configures the processor to generate a first mask for exposing a first region corresponding to the first and second sub patterns and a second region between the first and second sub patterns, a second mask for exposing a third region corresponding to the second pattern, and a third mask for dividing the first region exposed by the first mask into first and second sub regions corresponding to the first and second sub patterns, respectively.

According to an example embodiment, a method of forming patterns separated by a gap smaller than a critical dimension includes forming a target layer, forming an insulating layer over the target layer, forming a first mask on the insulating layer to expose a first region extending in a direction, forming a second mask to cover a second region, the second region separating the first region into two sub-regions, etching, using the first and second masks, the target layer to form two openings therein such that the two openings are separated by the gap corresponding to the second region, extend in the direction, and expose underlying conductive members therethrough, and forming conductive patterns confined by the two openings such that the conductive patterns physically contact the underlying conductive members.

BRIEF DESCRIPTION OF THE DRAWINGS

The above and other aspects and features of example embodiment will become more apparent by describing in detail some example embodiments thereof with reference to the attached drawings, in which.

DETAILED DESCRIPTION OF EXAMPLE EMBODIMENTS

Figure 1:
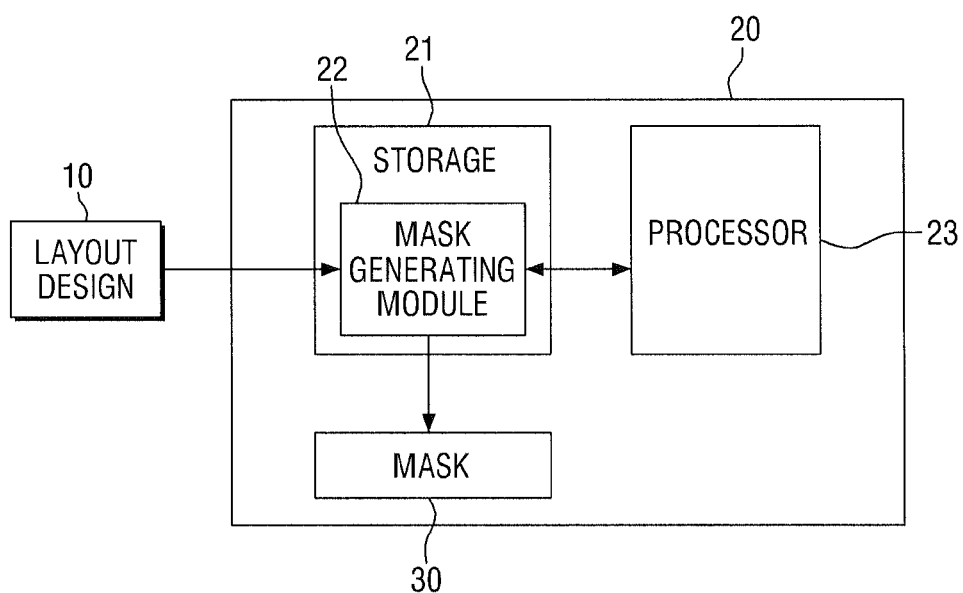
FIG. 1 is a block diagram of a computing system according to an example embodiment of the present invention.

Advantages and features of example embodiments and methods of accomplishing the same may be understood more readily by reference to the following detailed description of some example embodiments and the accompanying drawings. Example embodiments may, however, be embodied in many different forms and should not be construed as being limited to the example embodiments set forth herein. Rather, these example embodiments are provided so that this disclosure will be thorough and complete and will fully convey the concept of example embodiments to those skilled in the art, and example embodiments will only be defined by the appended claims. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the example embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the example embodiments.

The example embodiments will be described with reference to perspective views, cross-sectional views, and/or plan views. Thus, the profile of an example view may be modified according to manufacturing techniques and/or allowances. That is, the example embodiments of the invention are not intended to limit the scope of example embodiments, but to cover all changes and modifications that can be caused due to a change in manufacturing process. Thus, regions shown in the drawings are illustrated in schematic form and the shapes of the regions are presented simply by way of illustration and not as a limitation.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments. It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, some example embodiments will be explained in further detail with reference to the accompanying drawings.

FIG. 1 is a block diagram of a computing system 20 according to an example embodiment of the inventive concepts.

Referring to FIG. 1, the computing system 20 includes a storage unit 21 and a processor 23.

The term 'unit' or 'module', as used herein, means, but is not limited to, a software or hardware component, for example, a Field Programmable Gate Array (FPGA) or Application Specific Integrated Circuit (ASIC), which performs certain tasks. A unit or module may advantageously be configured to reside on an addressable storage medium and configured to execute by one or more processors. Thus, a unit or module may include, by way of example, components (e.g., software components, object-oriented software components, class components and task components, processes, functions, attributes, procedures, subroutines, segments of program code, drivers, firmware, microcode, circuitry, data, databases, data structures, tables, arrays, and variables). The functionalities provided for in the components, units, or modules may be performed by various smaller components, or modules in a combined manner, or may be separately performed by various smaller components, units, and/or modules.

The storage unit 21 may store or include a mask generating module 22. The mask generating module 22 may receive a layout design 10 and generate a mask 30 for forming patterns included in the layout design 10 using the processor 23.

In some example embodiments of the present invention, the mask generating module 22 may be implemented in the form of, for example, software. In this case, the mask generating module 22 may be stored in the storage unit 21 in a form of code, but example embodiments are not limited thereto.

In some example embodiments of the inventive concepts, the storage unit 21 may be a nonvolatile memory device. Examples of the nonvolatile memory device may include, but not limited to, a NAND flash, a NOR flash, a magnetic random access memory (MRAM), a phase-change random access memory (PRAM), and a resistive random access memory (RRAM). In some other example embodiments of the inventive concepts, the storage unit 21 may be a hard disk drive, a magnetic memory device, and/or any other like data storage mechanism capable of storing and recording data.

In FIG. 1, the mask generating module 22 is stored in storage unit 21. However, example embodiments are not limited thereto. In some example embodiments of the inventive concepts, the mask generating module 22 and/or other like software components may be stored in a plurality of storage units. In some embodiments, the mask generating module 22 and/or other like software components may also be loaded from a separate computer readable storage medium into the storage unit 21 using a drive mechanism (not shown). Such separate computer readable storage medium may include a floppy drive, Blu-ray/DVD/CD-ROM drive, a USB flash drive, a memory card, a memory stick, and/or any other like computer readable storage medium. In some embodiments, the mask generating module 22 and/or other like software components may be loaded into the storage unit 21 from a remote data storage device and/or a remote computing system via a network interface, rather than via storage unit 21.

The processor 23 may be special purpose computer processing devices configured to carry out program code stored in the one or more storage devices (e.g., storage unit 21) by performing arithmetical, logical, and input/output operations, thereby transforming the processor 23 into a special purpose processor. The processor 23 may be loaded with the mask generating module 22. Once the mask generating module 22 is loaded into the processor 23, the processor 23 may be configured to perform a mask generating operation according to various example embodiments. While only one processor 23 is illustrated in FIG. 1, example embodiments are not limited thereto. In some example embodiments of the inventive concepts, the processor 23 may be provided in a plurality. For example, the computing system 20 can be modified to run in a multi-core environment. If the computing system 20 runs in the multi-core environment, computation efficiency can be enhanced.

Although not specifically illustrated in the drawing, the processor 23 may additionally include a cache memory (e.g., L1, L2, etc.) in order to improve its computation capability. Furthermore, in some embodiments the computing system 20 may include many more components than those shown in FIG. 1, such as a display device, one or more image sensors, network interface, and/or other like physical hardware components. However, it is not necessary that all of these generally conventional components be shown in order to disclose the example embodiments.

A method of fabricating a semiconductor device according to an example embodiment of the inventive concepts will now be described with reference to FIGS. 2 through 4.

Figure 2:
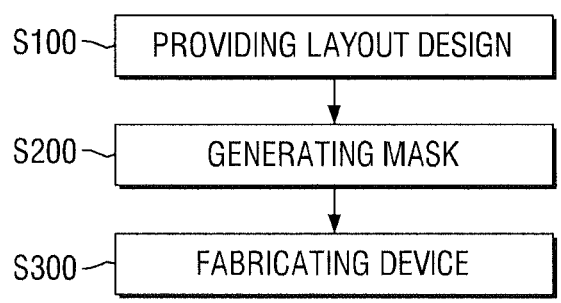
FIG. 2 is a flowchart illustrating a method of fabricating a semiconductor device according to an example embodiment of the present invention.

FIG. 2 is a flowchart illustrating a method of fabricating a semiconductor device according to an example embodiment of the inventive concepts. FIG. 3 is a diagram illustrating an example of a layout design. FIG. 4 is a diagram illustrating an example of masks generated by the mask generating module 22 of FIG. 1.

Referring to FIG. 2, a layout design is provided (operation S100).

The layout design may be designed and provided by a semiconductor device designer. Alternatively, in some example embodiments of the inventive concepts, the layout design may be designed and provided by, for example, a layout design tool implemented using software.

Hereinafter, a method of fabricating a semiconductor device using an example layout design of FIG. 3 according to an example embodiment will be described, but example embodiments are not limited to this example embodiment.

Figure 3:
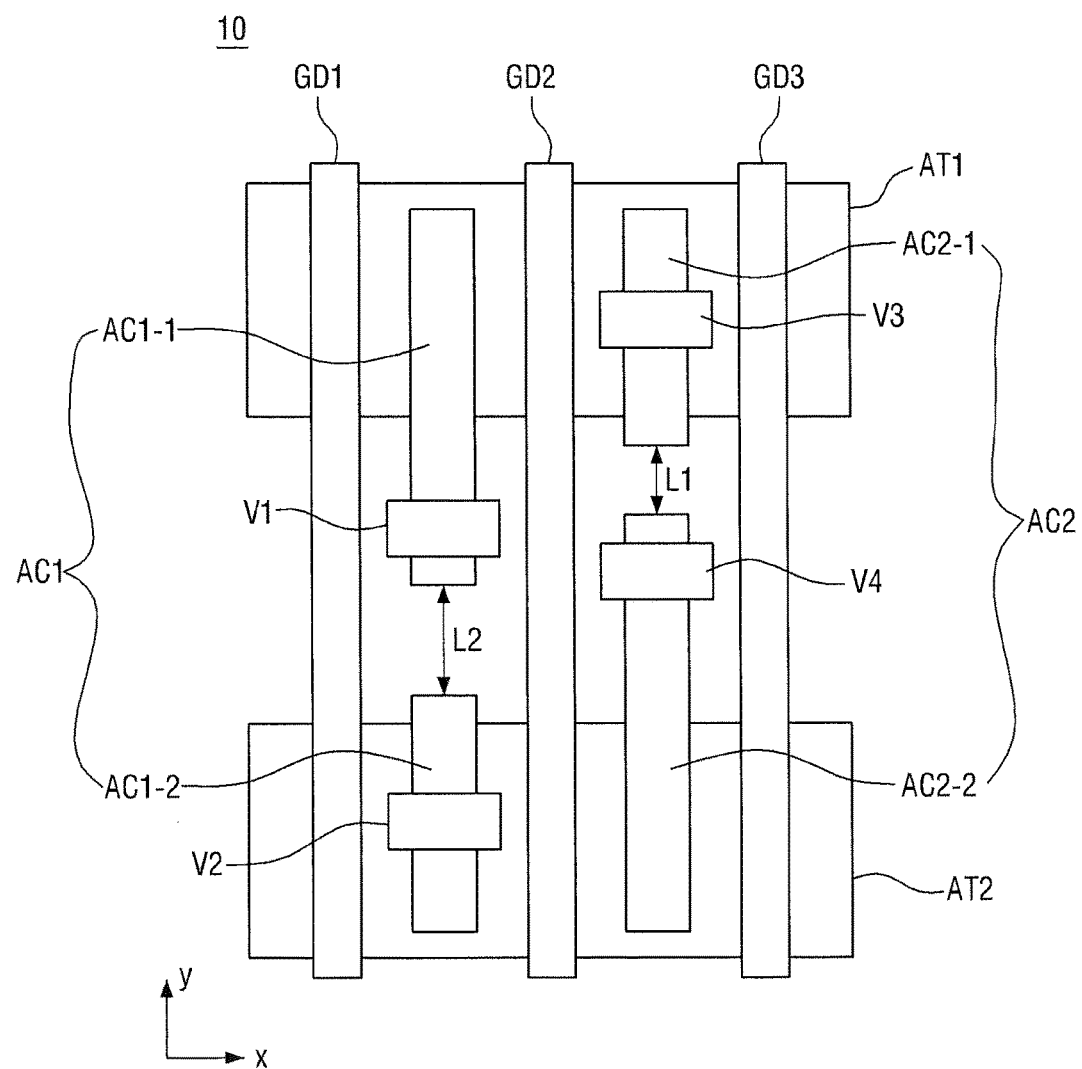
FIG. 3 is a diagram illustrating an example of a layout design.

Referring to FIG. 3, a layout design 10 includes first and second active pattern designs AT1 and AT2, first through third gate electrode designs GD1 through GD3, first and second active contact pattern designs AC1 and AC2, and first through fourth via designs V1 through V4.

The first and second active pattern designs AT1 and AT2 may extend along a first direction X. In some example embodiments of the inventive concepts, the first and second active pattern designs AT1 and AT2 may include active fin pattern designs. For example, in a fabrication process (operation S300 of FIG. 2) which will be described later, a first active fin pattern extending along the first direction X may be formed in a region in which the first active pattern design AT1 is defined, and a second active fin pattern extending along the first direction X may be formed in a region in which the second active pattern design AT2 is defined.

The first through third gate electrode designs GD1 through GD3 may be disposed on the first and second active pattern designs AT1 and AT2 to extend along a second direction Y. The first through third gate electrode designs GD1 through GD3 may be separated from each other in the first direction X as illustrated in the drawing.

The first and second active contact pattern designs AC1 and AC2 may be disposed among the first through third gate electrode designs GD1 through GD3 which are separated from each other. For example, the first active contact pattern design AC1 may be extend along the second direction Y between the first gate electrode design GD1 and the second gate electrode design GD2, and the second active contact pattern design AC2 may extend along the second direction Y between the second gate electrode design GD2 and the third gate electrode design GD3.

In the current example embodiment, the first active contact pattern design AC1 and the second active contact pattern design AC2 may be defined in the layout design 10 such that double patterning lithography can be used. For example, in the fabrication process (operation S300 of FIG. 2) which will be described later, a first active contact pattern 151 (see FIG. 16) fabricated using the first active contact pattern design AC1 and a second active contact pattern 152 (see FIG. 16) fabricated using the second active contact pattern design AC2 can be formed using double patterning lithography.

The first active contact pattern design AC1 may include a first sub-active contact pattern design AC1-1 and a second sub-active contact pattern design AC1-2. The second active contact pattern design AC2 may include a third sub-active contact pattern design AC2-1 and a fourth sub-active contact pattern design AC2-2.

The first sub-active contact pattern design AC1-1 and the second sub-active contact pattern design AC1-2 may be separated from each other in the second direction Y by a second gap L2. Further, the third sub-active contact pattern design AC2-1 and the fourth sub-active contact pattern design AC2-2 may be separated from each other in the second direction Y by a first gap L1.

In some example embodiments of the inventive concepts, the first gap L1 may be smaller than the second gap L2. The second gap L2 may be a value greater than a critical dimension at which patterning using double patterning lithography is possible, and the first gap L1 may be a value smaller than the critical dimension at which pattern using double patterning lithography is possible.

Therefore, in the fabrication process (operation S300 of FIG. 2) which will be described later, a first sub-active contact pattern 151-1 (see FIG. 16) and a second sub-active contact pattern 151-2 (see FIG. 16) fabricated using the first sub-active contact pattern design AC1-1 and the second sub-active contact pattern design AC1-2, respectively, can be formed using double patterning lithography. However, a third sub-active contact pattern 152-1 (see FIG. 16) and a fourth sub-active contact pattern 152-2 (see FIG. 16) fabricated using the third sub-active contact pattern design AC2-1 and the fourth sub-active contact pattern design AC2-2, respectively, cannot be formed together in a double patterning lithography process.

The first through fourth via designs V1 through V4 may be disposed on the first through fourth sub-active contact pattern designs AC1-1 through AC2-2 to overlap the first through fourth sub-active contact pattern designs AC1-1 through AC2-2, respectively. For example, the first via design V1 may overlap the first sub-active contact pattern design AC1-1, the second via design V2 may overlap the second sub-active contact pattern design AC1-2, the third via design V3 may overlap the third sub-active contact pattern design AC2-1, and the fourth via design V4 may overlap the fourth sub-active contact pattern design AC2-2.

Referring back to FIG. 2, a mask is generated (operation S200).

Referring back to FIG. 1, the mask generating module 22 may receive the layout design 10 and generate the mask 30 for forming patterns included in the layout design 10.

Figure 4:
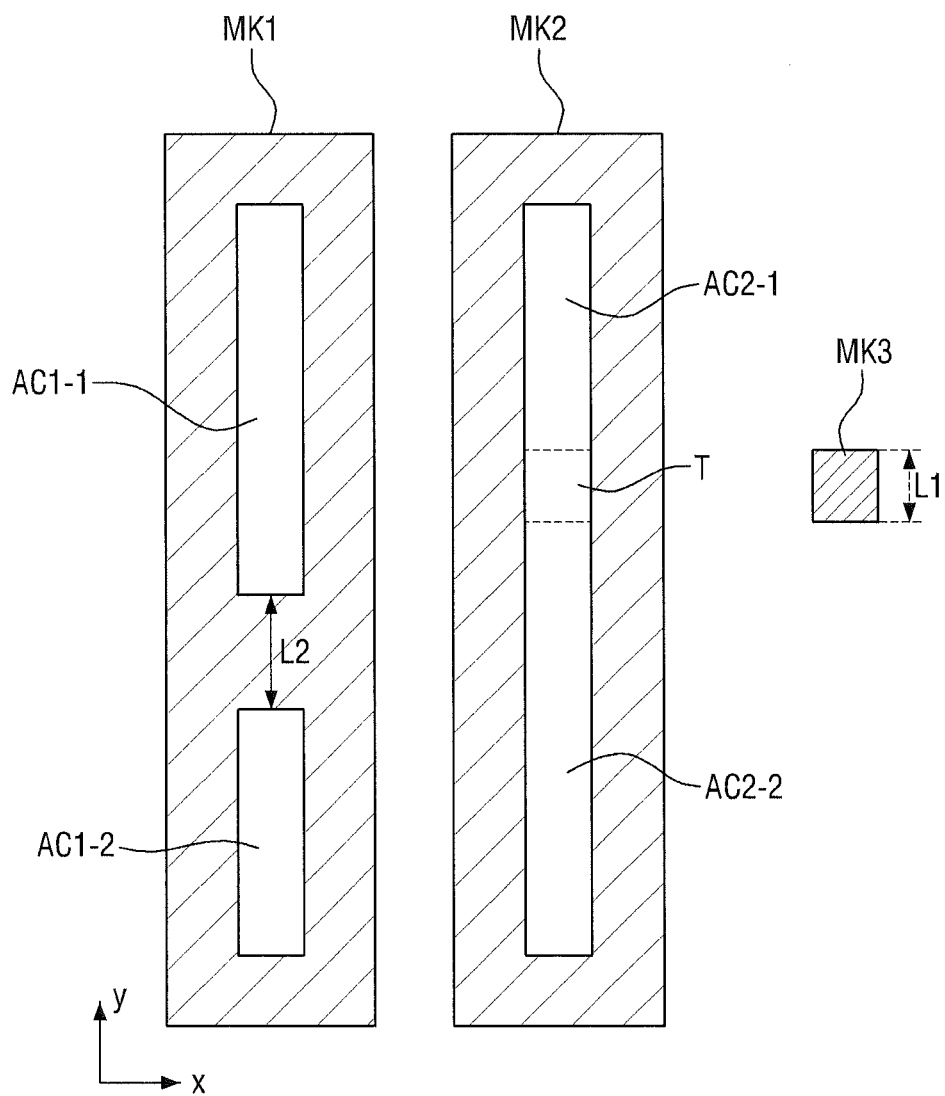
FIG. 4 is a diagram illustrating an example of masks generated by a mask generating module of FIG. 1.

In the current example embodiment, when receiving the layout design 10 illustrated in FIG. 3, the mask generating module 22 may generate first through third masks MK1 through MK3 as illustrated in FIG. 4.

For convenience of explanation, of the masks generated by the mask generating module 22 based on the layout design 10 of FIG. 3, only the first through third masks MK1 through MK3, which are used to fabricate the first through fourth sub-active contact patterns 151-1 through 152-2 (see FIG. 16) based on the first through fourth sub-active contact pattern designs AC1-1 through AC2-2, are illustrated in FIG. 4.

Referring to FIG. 4, the first mask MK1 is generated by the mask generating module 22 to form the first and second sub-active contact patterns 151-1 and 151-2 (see FIG. 16) based on the first and second sub-active contact pattern designs AC1-1 and AC1-2.

The second and third masks MK2 and MK3 are generated by the mask generating module 22 to form the third and fourth sub-active contact patterns 152-1 and 152-2 (see FIG. 16) based on the third and fourth sub-active contact pattern designs AC2-1 and AC2-2.

The first mask MK1 may be used to form the first and second sub-active contact patterns 151-1 and 151-2 (see FIG. 16) based on the first and second sub-active contact pattern designs AC1-1 and AC1-2 which are separated from each other by the second gap L2 greater than the critical dimension at which patterning using double patterning lithography is possible. This can be fully appreciated by those of ordinary skill in the art and thus will not be described in detail.

To form the third and fourth sub-active contact patterns 152-1 and 152-2 (see FIG. 16) based on the third and fourth sub-active contact pattern designs AC2-1 and AC2-2 which are separated from each other by the first gap L1 smaller than the critical dimension at which patterning using double patterning lithography is possible, the second mask MK2 may be used as a merge mask, and the third mask MK3 may be used as a cut mask.

For example, the second mask MK2 may be used to expose regions defined as the third sub-active contact pattern design AC2-1 (see FIG. 3) and the fourth sub-active contact pattern design AC2-2 (see FIG. 3) and a region T between the third sub-active contact pattern design AC2-1 and the fourth sub-active contact pattern design AC2-2 in FIG. 3. The third mask M3 may be used to divide a region exposed by the second mask MK2 into a region in which the third sub-active contact pattern design AC2-1 (see FIG. 3) is defined and a region in which the fourth sub-active contact pattern design AC2-2 (see FIG. 3) is defined.

According to some example embodiments, the mask generating module 22, based on the provided layout design 10, may generate a first mask MK 1 with regard to patterns separated by a gap (e.g., L2), which is greater than a critical dimension at which patterning using double patterning lithography is possible, and the mask generating module 22 generates a merge mask MK2 (which merges the separated patterns and the gap provided therebetween) and a cut mask MK3 (separating the patterns by defining a gap therebetween) with regard to patterns being separated by a gap (e.g., L1) smaller than the critical dimension at which patterning using double patterning lithography is possible.

The above operation of the mask generating module 22 can be executed by, for example, a special purpose processor (e.g. processor 23). For instance, the mask generating module 22 may be stored as computer readable code and/or program code on a computer readable recording medium, which when loaded into a processor (e.g. processor 23) configures the processor to transform into a special purpose processor and causes the special purpose processor to perform the operation of the mask generating module 22 as described above. The computer readable recording medium may be any data storage device that can store data which can be thereafter read and/or executed by a computer system. Examples of the computer readable recording medium include, for example, read-only memory (ROM), random-access memory (RAM), Blu-ray/DVD/CD-ROMs, magnetic tapes, floppy disks, optical data storage devices, and carrier waves (e.g., transmission through the Internet), and/or any other like tangible or intangible medium. The computer readable recording medium can also be distributed over network coupled with computer systems so that the computer readable code can be stored and/or executed in a distributed fashion.

Referring back to FIG. 2, a semiconductor device is fabricated using the generated mask (operation S300). This will be described in greater detail with reference to FIGS. 5 through 18C.

Figure 5:
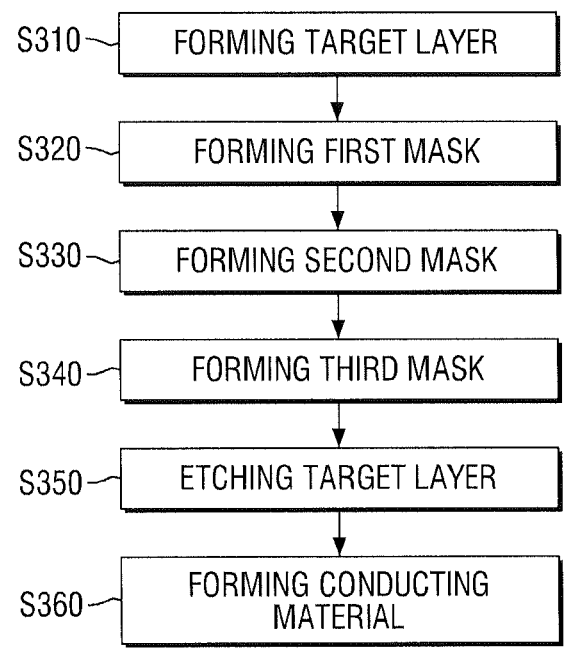
FIG. 5 is a flowchart illustrating a method of fabricating a semiconductor device according to an example embodiment of the present invention.

FIG. 5 is a flowchart illustrating a method of fabricating a semiconductor device according to an example embodiment of the inventive concepts. FIGS. 6 through 17C are views illustrating steps of the method of fabricating a semiconductor device according to an example embodiment of the inventive concepts.

Figure 6:
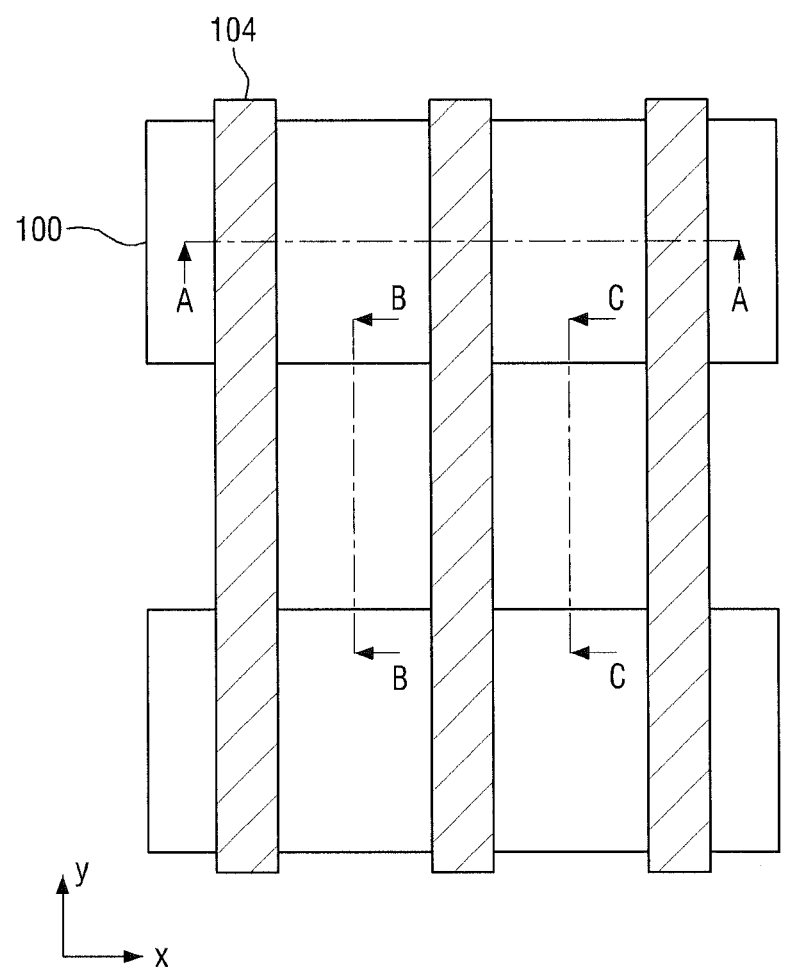
FIGS. 6 through 17C are views illustrating steps of the method of fabricating a semiconductor device according to an example embodiment of the present invention.

FIGS. 7A through 15A are cross-sectional views taken along the line A-A of FIG. 6, FIGS. 7B through 15B are cross-sectional views taken along the line B-B of FIG. 6, and FIGS. 7C through 15C are cross-sectional views taken along the line C-C of FIG. 6. For ease of description, active patterns 100 and gate electrodes 104 only are illustrated in FIG. 6.

Figure 16:
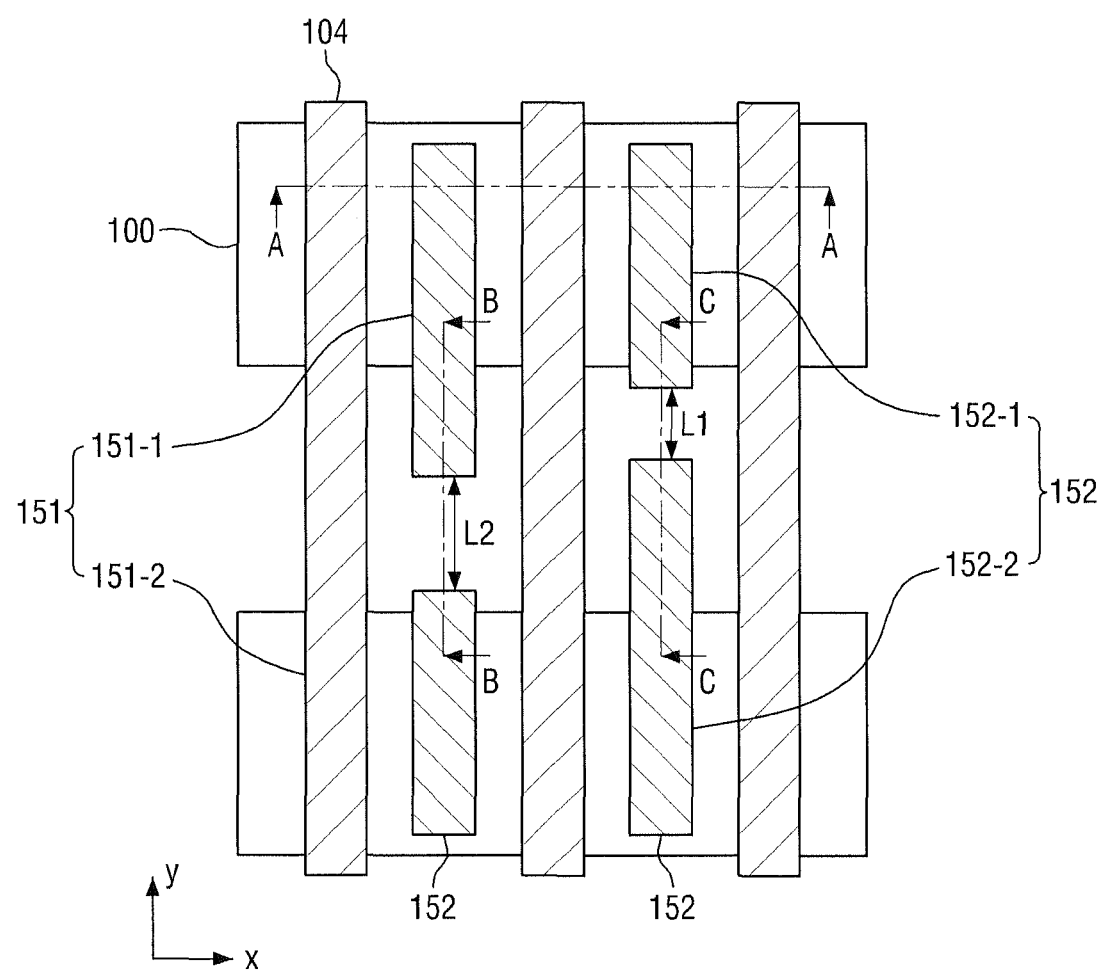
Figure 17A:
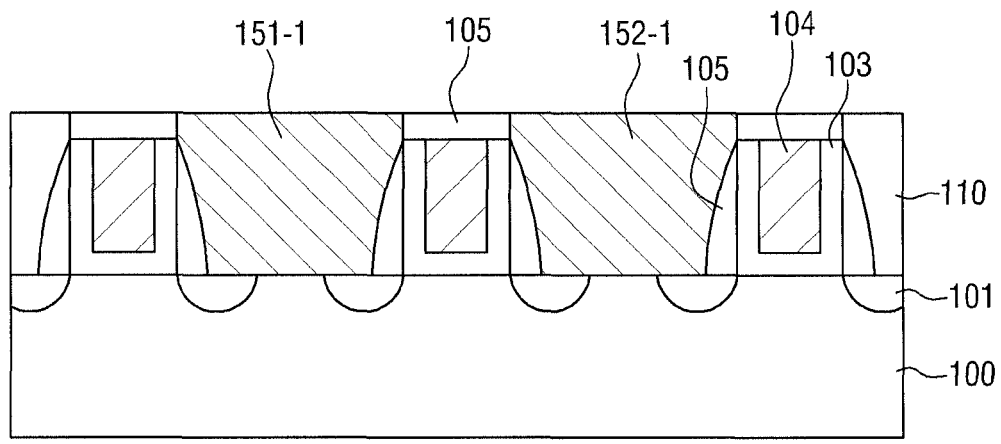
Figure 17B:
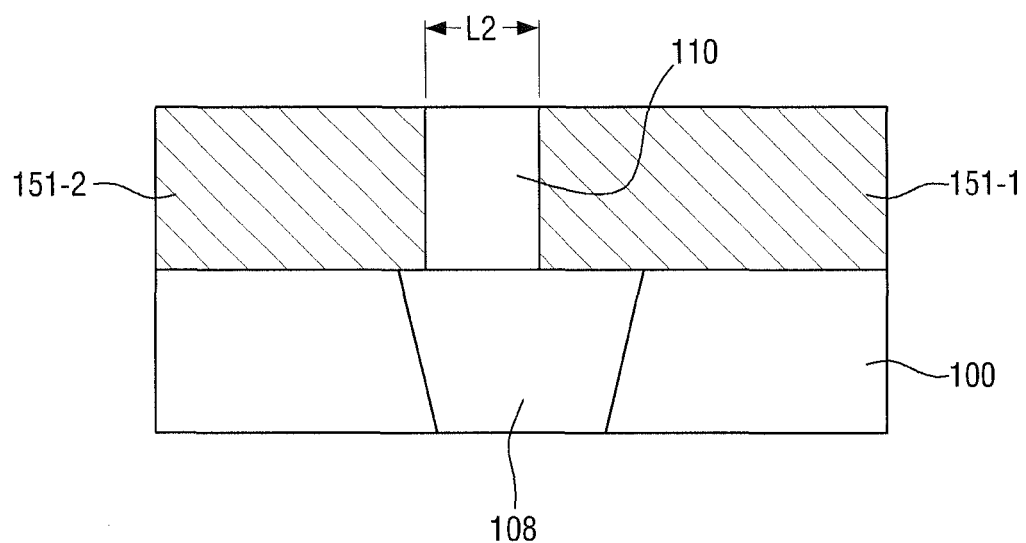
Figure 17C:
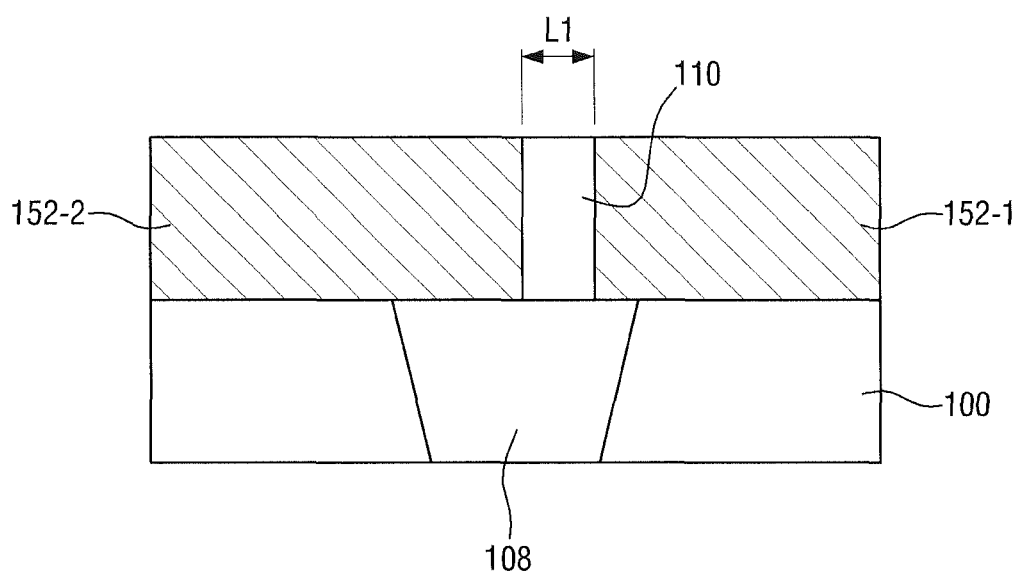

FIG. 17A is a cross-sectional view taken along the line A-A of FIG. 16, FIG. 17B is a cross-sectional view taken along the line B-B of FIG. 16, and FIG. 17C is a cross-sectional view taken along the line C-C of FIG. 16. For ease of description, the active patterns 100, the gate electrodes 104, and the first and second active contact patterns 151 and 152 only are illustrated in FIG. 16.

A process of forming the first and second active contact patterns 151 and 152 (see FIG. 16) in the regions defined as the first through fourth sub-active contact pattern designs AC-1 through AC2-2 (see FIG. 3) using the three masks MK1 through MK3 (see FIG. 4) generated by the mask generating module 22 (see FIG. 1) will now be described in detail. However, example embodiments are not limited thereto, and other designs included in a layout design (e.g., the layout design 10 of FIG. 1) can also be formed as patterns using the same or a similar method.

Referring to FIG. 5, a target layer is formed (operation S310).

Figure 7A:
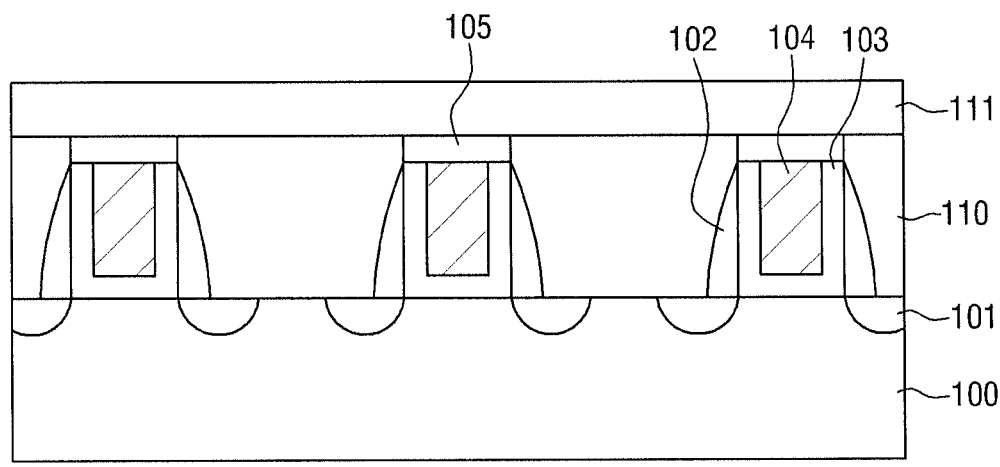
Figure 7B:
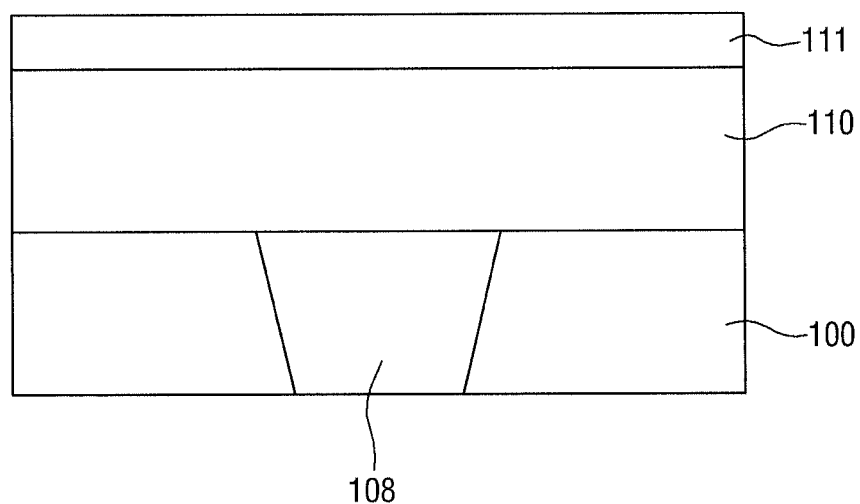
Figure 7C:
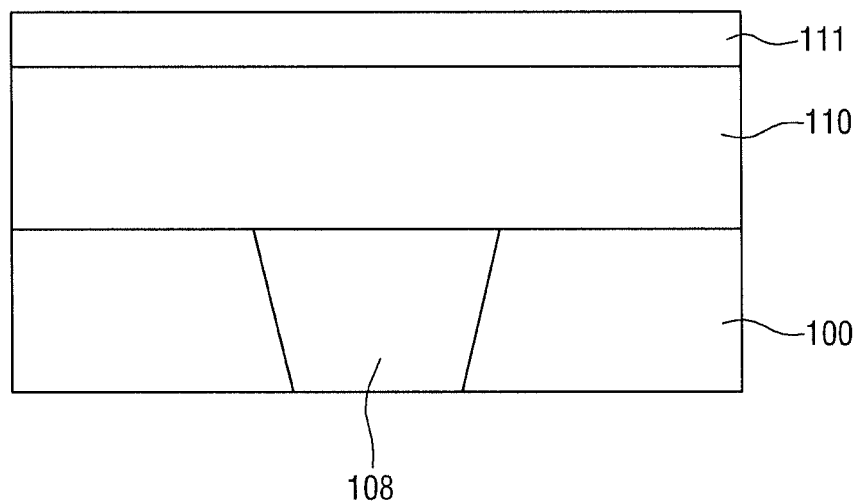

Referring to FIGS. 6 through 7C, the target layer according to the current example embodiment includes at least one of a first interlayer insulating film 110 and a second interlayer insulating film 111. Each of the first interlayer insulating film 110 and the second interlayer insulating film 111 may include, for example, a silicon oxide layer ($SiO_2$), a silicon nitride layer (SiN), a silicon oxynitride layer (SiON), etc.

In some example embodiments of the inventive concepts, the target layer may include at least one of the first interlayer insulating film 110 and the second interlayer insulating film 111. The first interlayer insulating film 110 and/or the second interlayer insulating film 111 may be formed of an oxide layer. At least one of the first interlayer insulating film 110 and the second interlayer insulating film 111 may be formed on the active patterns 100.

In some example embodiments of the inventive concepts, the active patterns 100 may be active fin patterns extending along the first direction X. If the gate electrodes 104 are formed on the active fin patterns 100, a channel area may be increased, thereby improving operating characteristics of a semiconductor device (e.g., a transistor).

If each of the active patterns 100 is an active fin pattern, it may be formed by partially etching a substrate (not illustrated). In this case, the substrate (not illustrated) and each of the active patterns 100 may include the same material. However, example embodiments are not limited thereto, and the active patterns 100 can also be formed using a different method. For example, in some example embodiments of the inventive concepts, each of the active patterns 100 may be formed by growing an epitaxial layer on the substrate (not illustrated) and etching the grown epitaxial layer.

The active patterns 100 may include, for example, a semiconductor material. The active patterns 100 may be made of one or more semiconductor materials selected from the group consisting of Si, Ge, SiGe, GaP, GaAs, SiC, SiGeC, InAs, and InP.

Further, the active patterns 100 may include a compound semiconductor, for example, a group IV-IV compound semiconductor or a group III-V compound semiconductor. For example, the group IV-IV compound semiconductor that forms the epitaxial layer may be a binary or ternary compound containing two or more of carbon (C), silicon (Si), germanium (Ge) and tin (Sn) or a compound obtained by doping the binary or ternary compound with a group IV element. The group III-V compound semiconductor that forms the epitaxial layer may be a binary, ternary, or quaternary compound composed of at least one of aluminum (Al), gallium (Ga) and indium (In) (i.e., group III elements) bonded with one of phosphorus (P), arsenic (As) and antimony (Sb) (i.e., group V elements).

A device isolation layer 108 may be formed between the active patterns 100 extending along the first direction X. The device isolation layer 108 may be, for example, an insulating layer. The device isolation layer 108 may be, for example, a silicon oxide layer ($SiO_2$), a silicon nitride layer (SiN), or a silicon oxynitride layer (SiON).

In some example embodiments of the inventive concepts, the device isolation layer 108 may be, for example, a shallow trench isolation (STI) layer. In some other example embodiments of the inventive concepts, the device isolation layer 108 may be a deep trench isolation (DTI) layer. The device isolation layer 108 according to example embodiments of the inventive concepts is not limited to the one illustrated in the drawings.

The gate electrodes 104 extending along the second direction Y may be formed on the active patterns 100 extending along the first direction X. The gate electrodes 104 may be separated from each other in the first direction X.

Each of the gate electrodes 104 may include a metal gate electrode. For example, each of the gate electrodes 104 may include a metal with high conductivity. Examples of the metal may include, for example, Al or W.

Although not specifically illustrated in the drawings, each of the gate electrodes 104 may include a work function layer (not illustrated). For example, if the semiconductor device illustrated in the drawings is a p-channel metal oxide semiconductor (PMOS) transistor, the work function layer (not illustrated) may include a P-type work function layer. The P-type work function layer may include, for example, at least one of TiN and TaN. The P-type work function layer may be, for example, a single layer made of TiN or a double layer including a Tin lower layer and a TaN upper layer.

If the semiconductor device illustrated in the drawings is an n-channel metal oxide semiconductor (NMOS) transistor, the work function layer (not illustrated) may include an N-type work function layer. Examples of the N-type work function layer may include, for example, TiAl, TiAlN, TaC, TaAlN, TiC, and HfSi.

A gate insulating layer 103 may be formed under each of the gate electrodes 104. The gate insulating layer 103 may extend upward along sidewalls of spacers 120. The gate insulating layer 103 may have such a shape when the semiconductor device is formed by a gate replacement process.

In some example embodiments of the inventive concepts, the gate insulating layer 103 may include a high-k layer. If the gate insulating layer 103 is a high-k layer, the gate insulating layer 103 may be made of a material, for example, $HfO_2$, $Al_2O_3$, $ZrO_2$, $TaO_2$, etc.

Although not specifically illustrated in the drawings, an interface layer (not illustrated) may be formed between the gate insulating layer 103 and the active pattern 100 to prevent or mitigate a poor interface property between the active pattern 100 and the gate insulating layer 103. The interface layer may include a low-k material layer having a dielectric constant (k) of 9 or less. For example, such materials include a silicon oxide layer (having a dielectric constant k of approximately 4) or a silicon oxynitride layer (having a dielectric constant k of approximately 4 to 8 according to contents of oxygen and nitrogen atoms). Further, the interface layer may be made of silicate or any combination of the above example layers.

Source and drain regions 101 may be formed on both sides of each of the gate electrodes 104. Although the source and drain regions 101 are formed in the active patterns 100 in the drawings, example embodiments are not limited thereto. In some other example embodiments of the inventive concepts, the source and drain regions 101 may be formed by, e.g., an epitaxial growth process.

The source and drain regions 101 may be separated from each of the gate electrodes 104 and may be further separated from each other by the spacers 102. For example, the spacers 102 may be disposed on at least one side of each of the gate electrodes 104 as illustrated in the drawings. In addition, the spacers 102 may be disposed between each of the gate electrodes 104 and the source and drain regions 101.

Each of the spacers 102 may include at least one of a nitride layer and an oxynitride layer. In FIG. 7A, a side surface of each of the spacers 102 is curved, but example embodiments are not limited thereto. For example, each of the spacers 102 may be formed in any shape. For example, in some example embodiments of the inventive concepts, the shape of each of the spacers 102 can be, for example, an 'I' shape or an 'L' shape.

A capping layer 105 may be formed on each of the gate electrodes 104. The capping layer 105 may be used to form the active contact pattern 152 (see FIG. 17) in a self-aligned way. For example, the capping layer 105 can mitigate or prevent the active contact pattern 152 (or alternatively, 151) (see FIG. 17) and the gate electrodes 104 from being electrically short-circuited with each other.

The capping layer 105 may include, for example, a nitride layer. Although the capping layer 105 is formed on each of the gate electrodes 104 in the drawings, the capping layer 105 can be omitted if an electrically short between the active contact patterns 152 (or alternatively, 151) (see FIG. 17) and the gate electrodes 104 can be mitigated or prevented in an alternative manner.

At least one of the first interlayer insulating film 110 and the second interlayer insulating film 111 used as the target layer in the current example embodiment may be formed to cover the active patterns 100, the spacers 102, the gate insulating layers 103, and the gate electrodes 104.

Referring to FIG. 5, a first mask is formed (operation S320).

The first mask may correspond to the second mask MK2 (see FIG. 4) described above. This will now be described in greater detail with reference to FIGS. 8A through 10C.

Figure 8A:
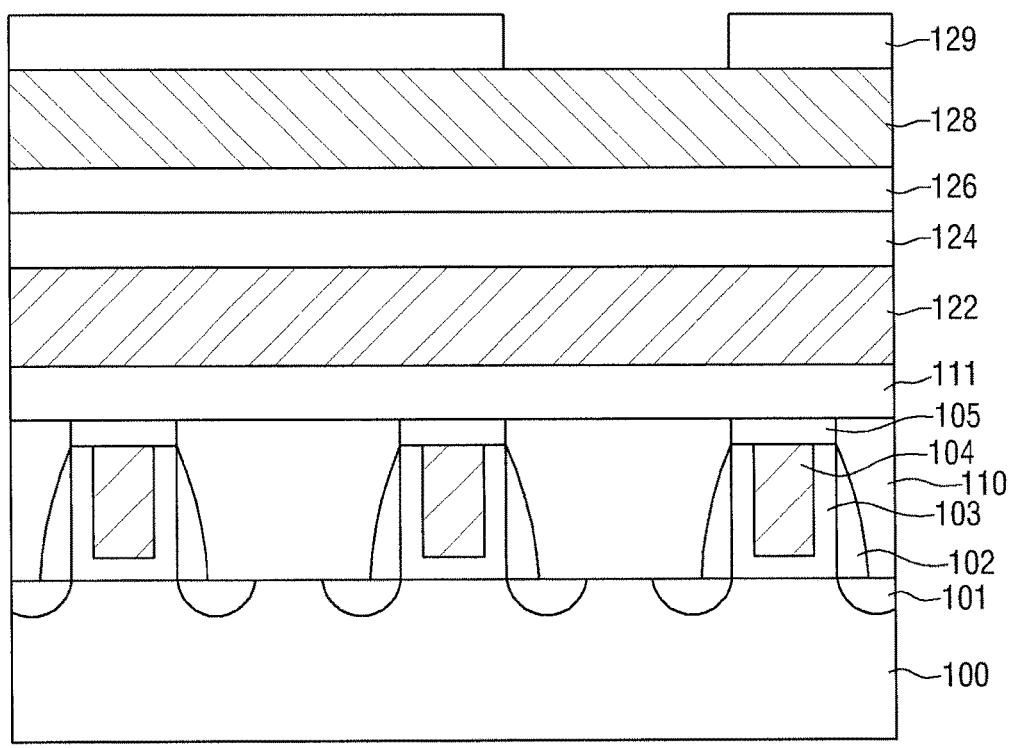
Figure 8B:
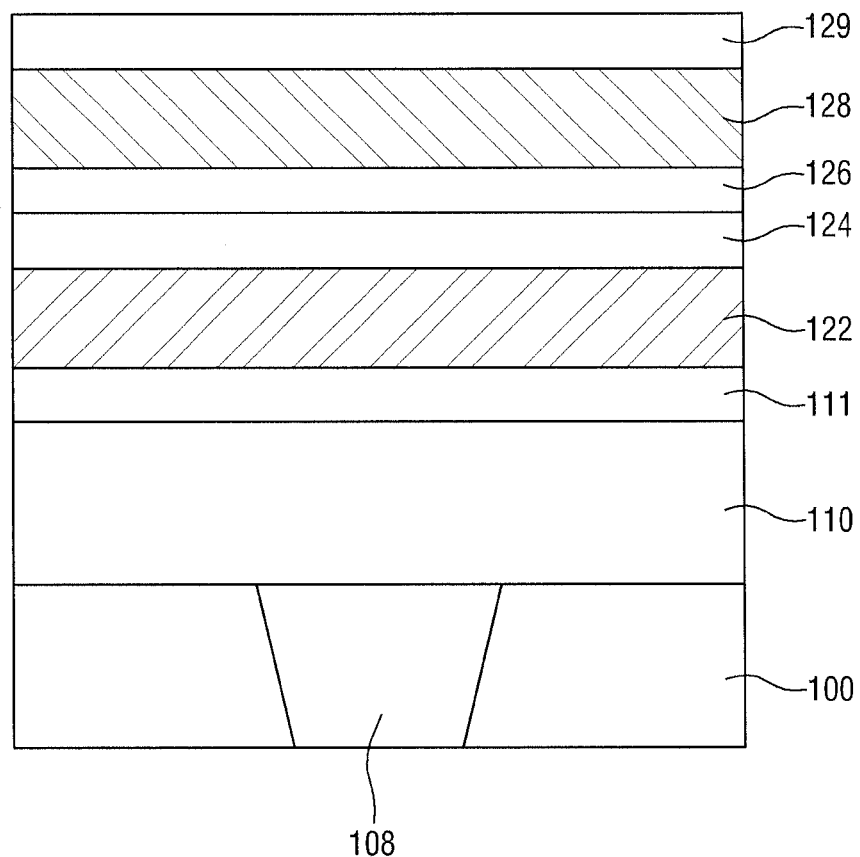
Figure 8C:
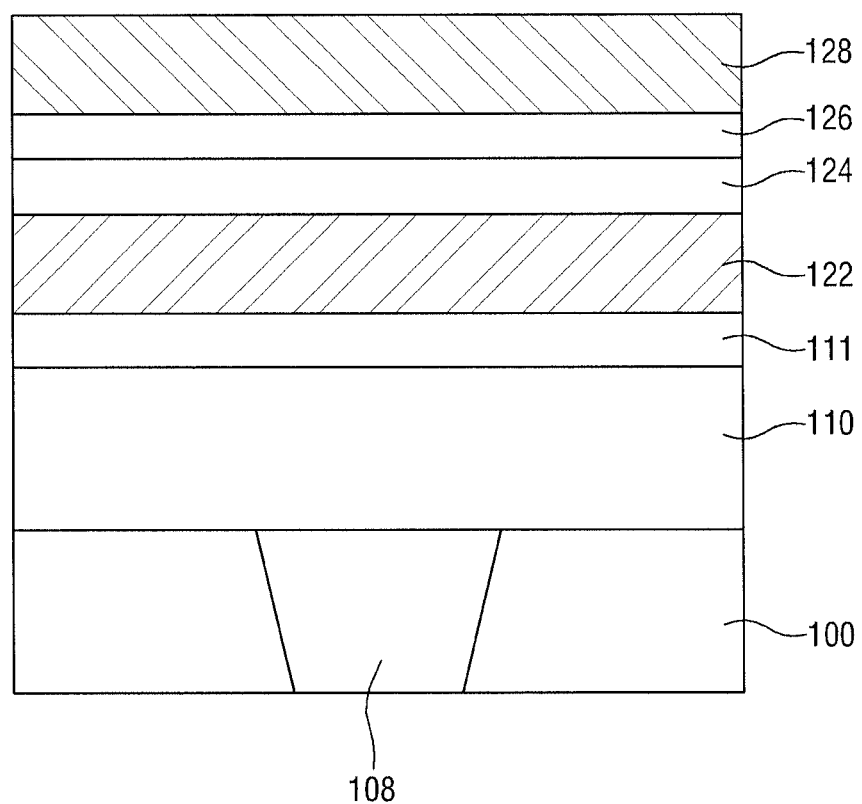

Referring to FIGS. 8A through 8C, a first organic layer 122, an oxide layer 124, a hard mask layer 126, and a second organic layer 128 are sequentially formed on the target layer, which includes at least one of the first interlayer insulating film 110 and the second interlayer insulating film 111.

Each of the first and second organic layers 122 and 128 may include, for example, a spin-on hard mask (SOH) layer, and the hard mask layer 126 may include, for example, a silicon nitride layer (SiN).

A first photoresist pattern 129 is formed on the second organic layer 128 to expose the region in which the second active contact pattern design AC2 (see FIG. 3) is defined. Accordingly, the first photoresist pattern 129 is not formed on the second organic layer 128 illustrated in FIG. 8C.

Figure 9A:
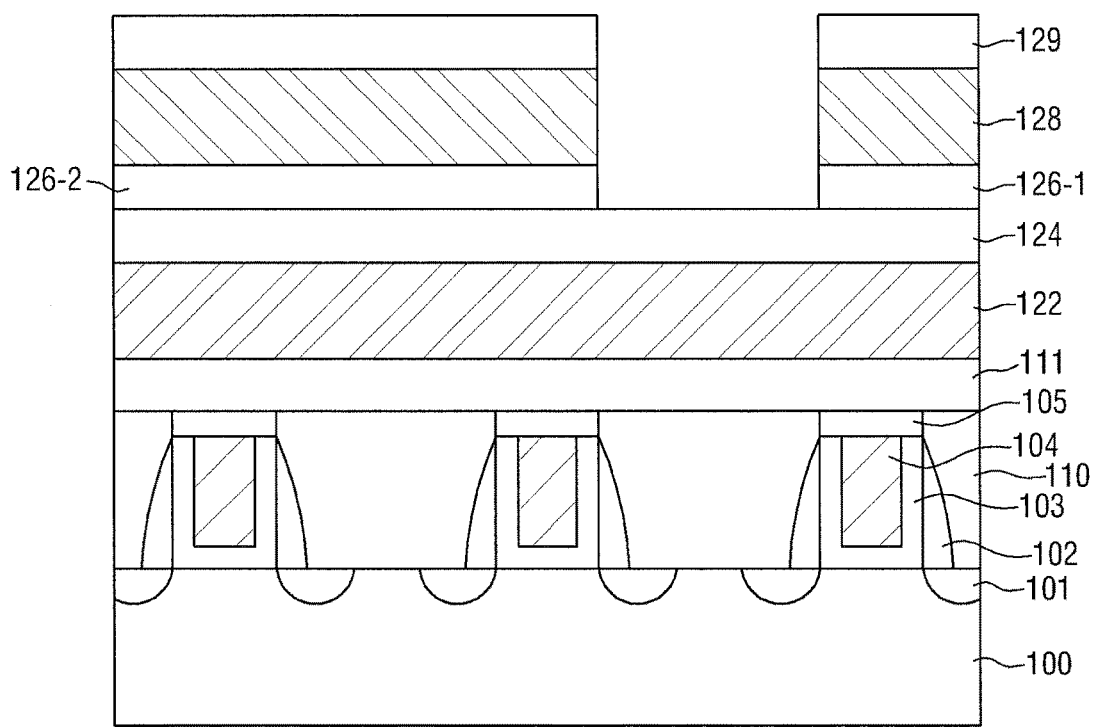
Figure 9B:
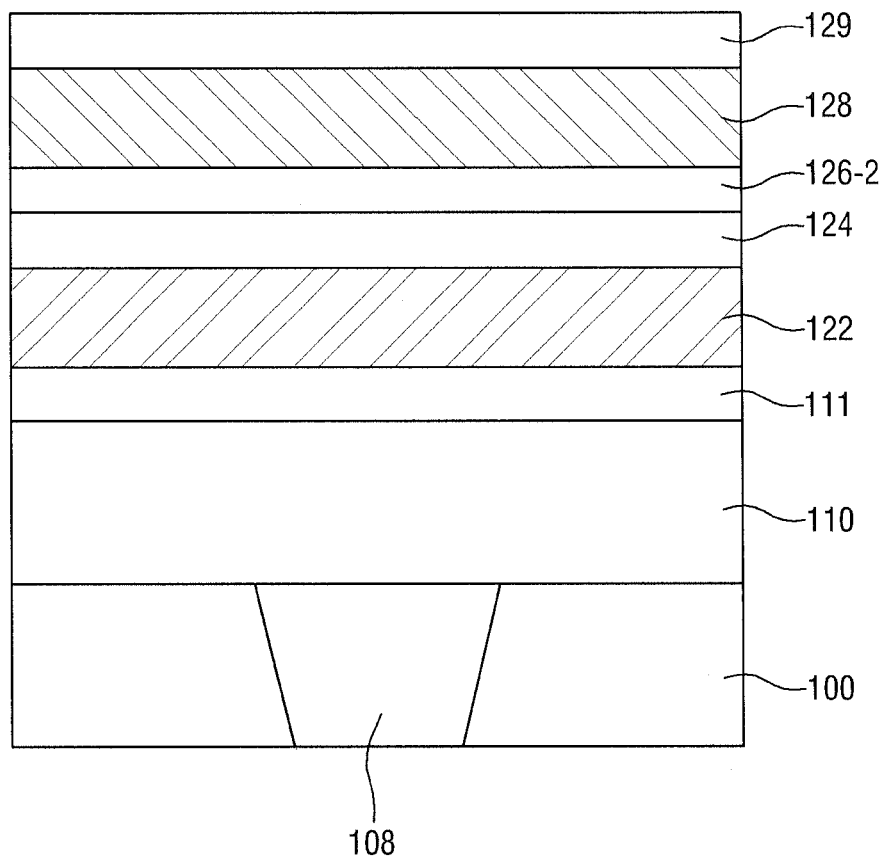
Figure 9C:
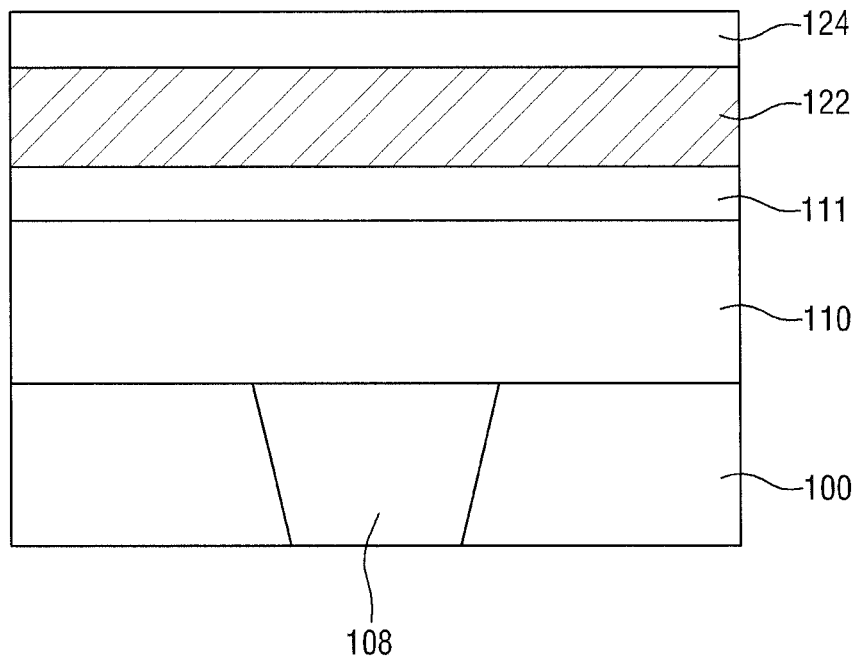

Referring to FIGS. 9A through 9C, the hard mask layer 126 and the second organic layer 128 are etched using the first photoresist pattern 129 as a mask. Accordingly, the hard mask layer 126 is divided into a first hard mask layer pattern 126-1 and a second hard mask layer pattern 126-2. The second organic layer 128 and the hard mask layer 126 disposed on the oxide layer 124 illustrated in FIG. 8C are all removed.

In this etching process, the oxide layer 124 may be used as an etch-stop layer. For example, the hard mask layer 126 and the second organic layer 128 may be etched until the oxide layer 124 is exposed using the first photoresist pattern 129 as a mask.

Figure 10A:
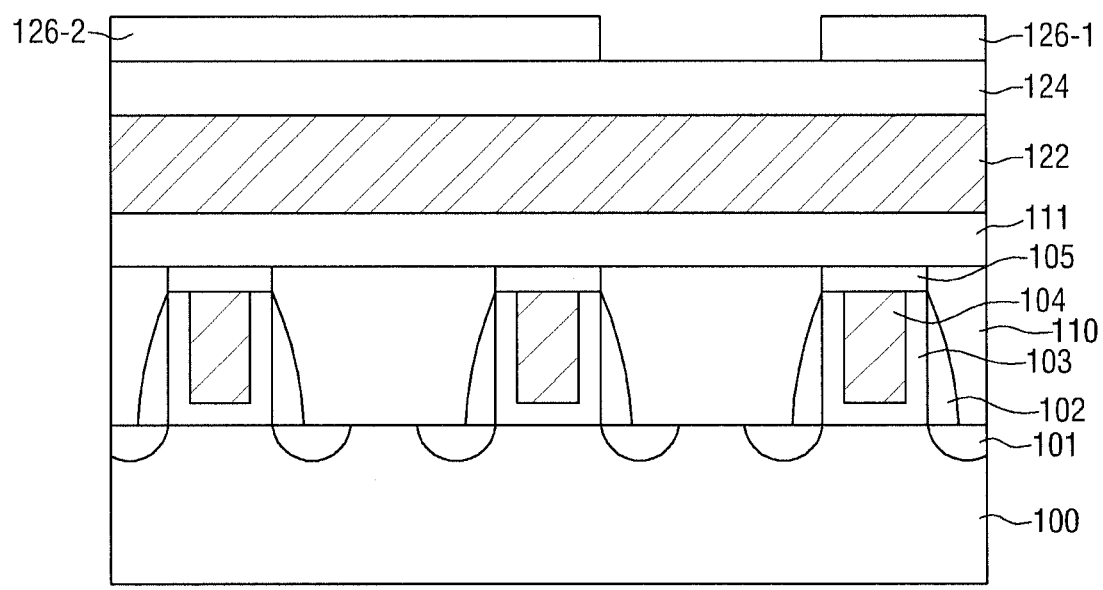
Figure 10B:
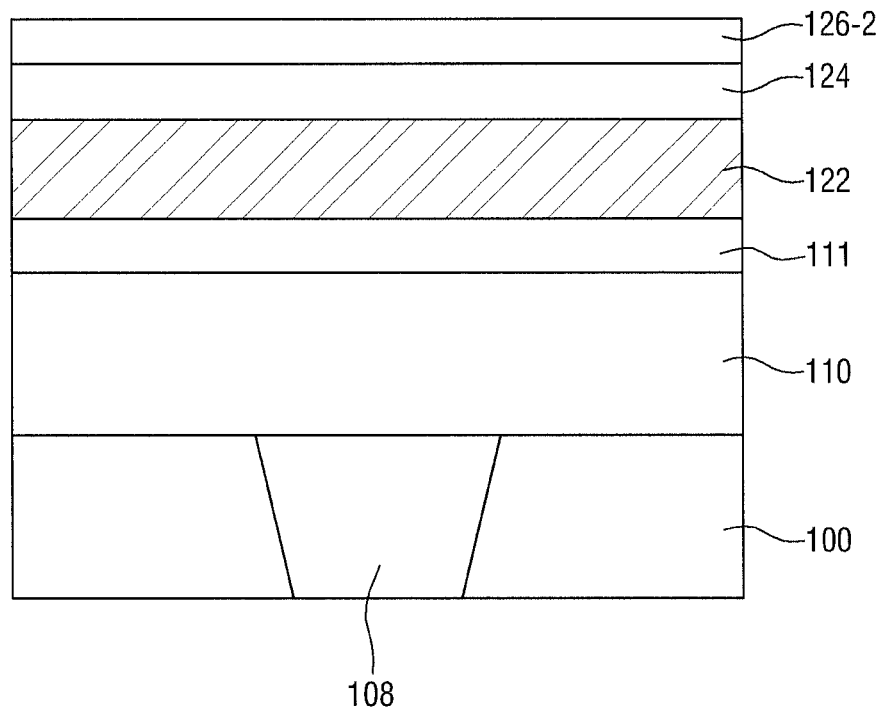
Figure 10C:
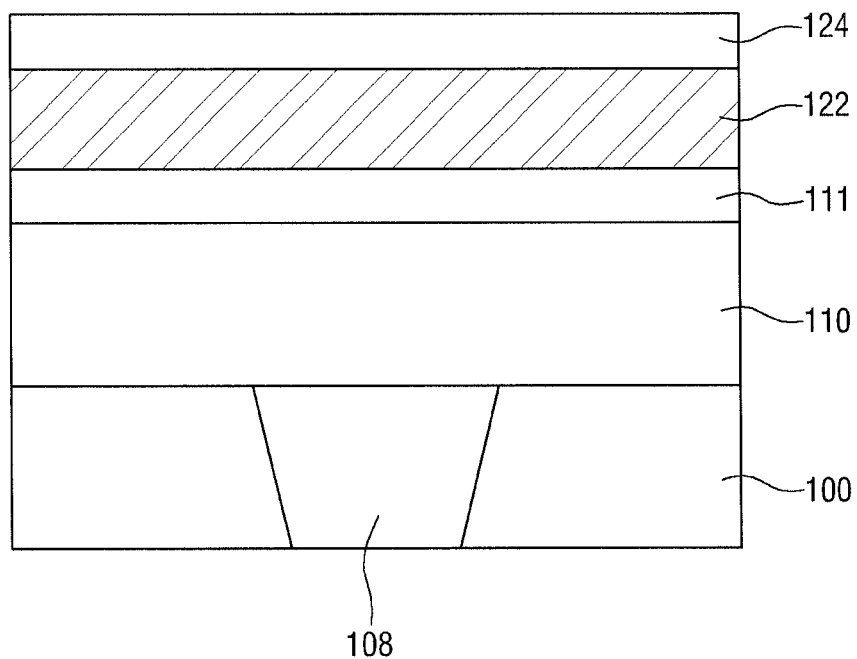

Referring to FIGS. 10A through 10C, the remaining first photoresist pattern 129 and the remaining second organic layer 128 are removed using an ashing process and/or a stripping process.

The first hard mask layer pattern 126-1 and the second hard mask layer pattern 126-2 thus formed may correspond to the second mask MK2 (see FIG. 4) described above. Thus, the first and second hard mask layer patterns 126-1 and 126-2 may expose the regions in which the third sub-active contact pattern design AC2-1 and the fourth sub-active contact pattern design AC2-2 are defined and the region T between the third sub-active contact pattern design AC2-1 and the fourth sub-active contact pattern design AC2-2 in FIG. 3.

Referring to FIG. 5, a second mask is formed (operation S330).

The second mask may correspond to the first mask MK1 (see FIG. 1) described above. This will now be described in greater detail with reference to FIGS. 11A through 12C.

Figure 11A:
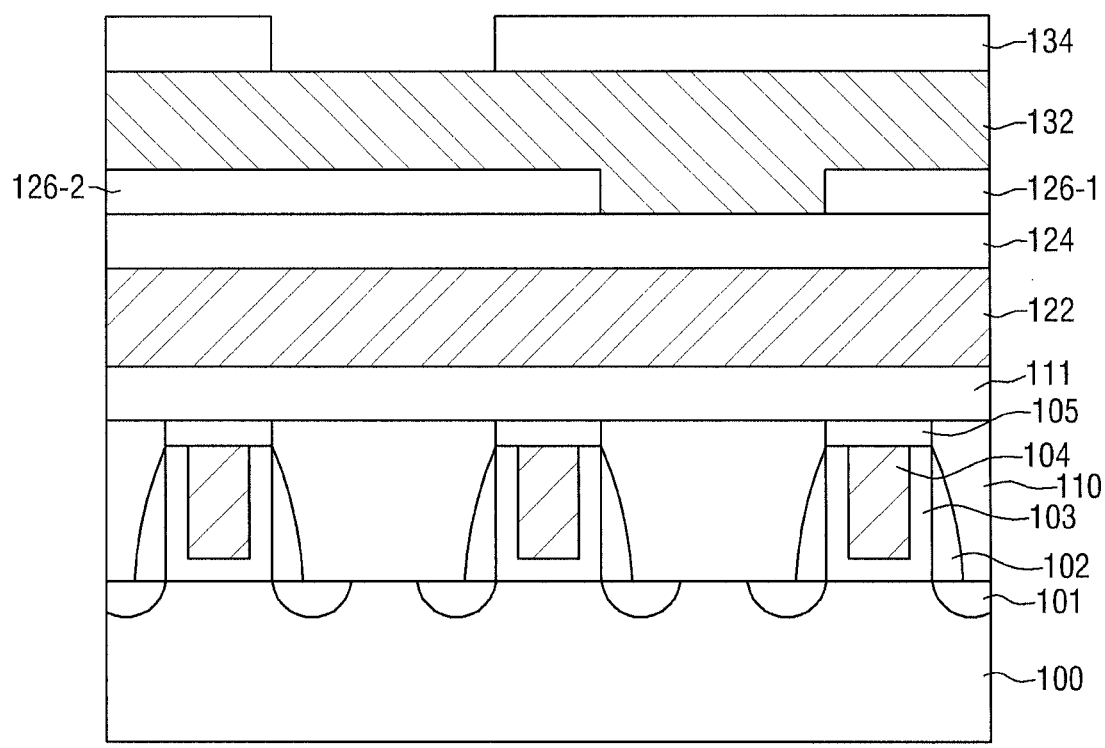
Figure 11B:
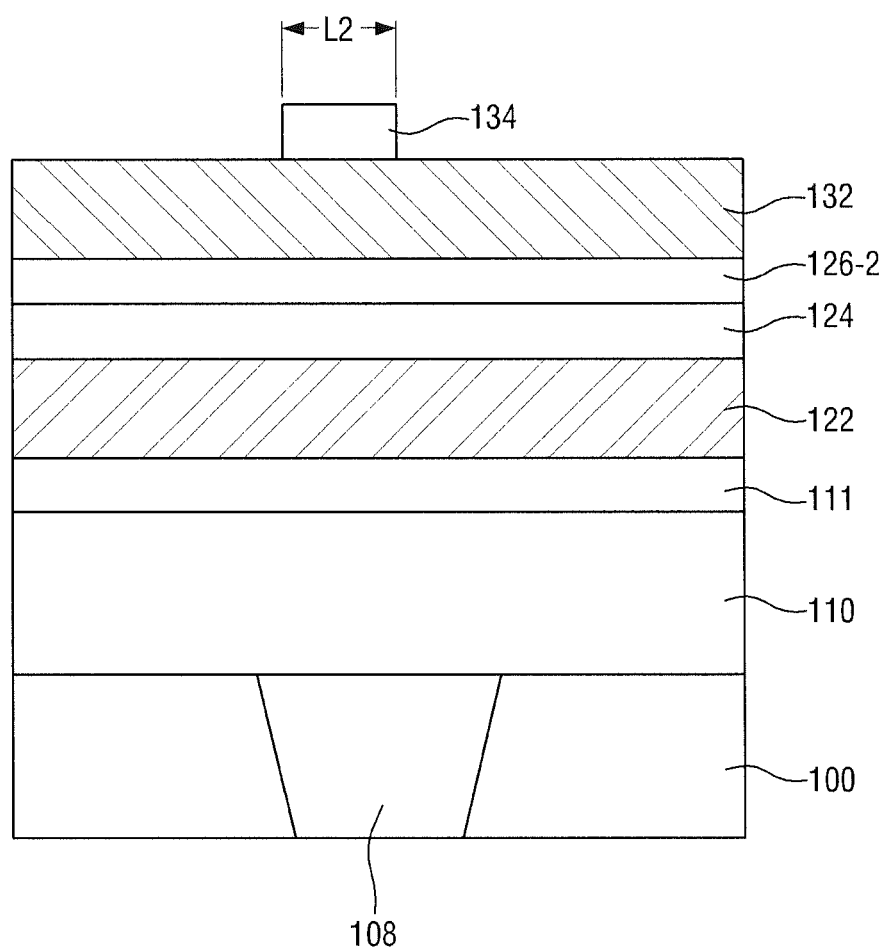
Figure 11C:
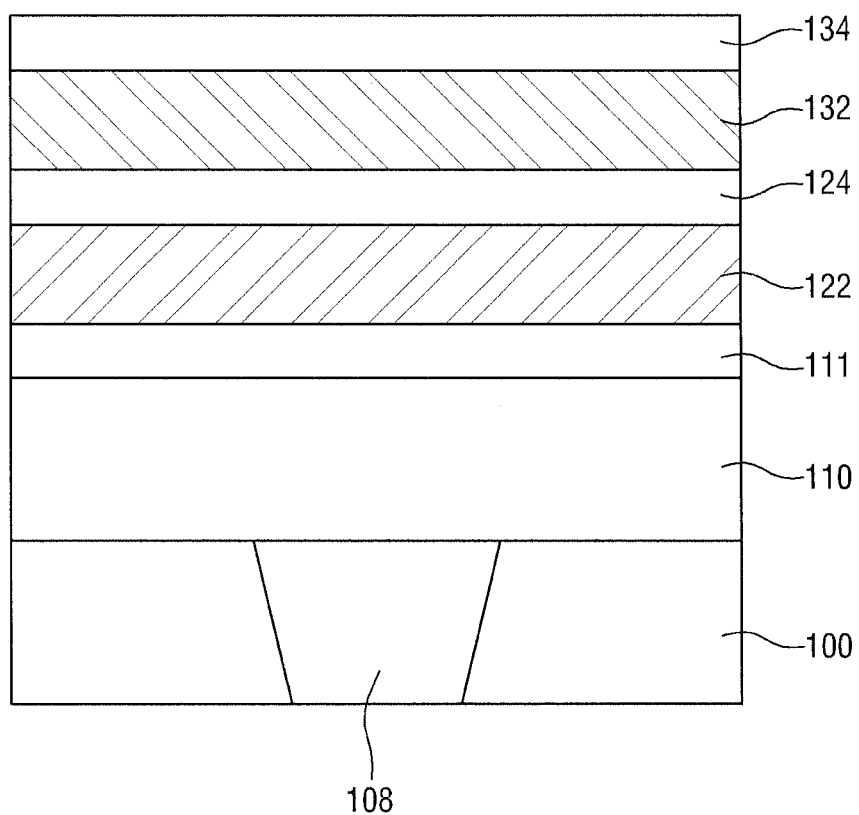

Referring to FIGS. 11A through 11C, a third organic layer 132 is formed on the first and second hard mask layer patterns 126-1 and 126-2. Here, the third organic layer 132 may include, for example, an SOH layer.

A second photoresist pattern 134 is formed on the third organic layer 132 to expose the regions in which the first sub-active contact pattern design AC1-1 (see FIG. 3) and the second sub-active contact pattern design AC1-2 (see FIG. 3) are defined. Accordingly, the second photoresist pattern 134 having a length equal to the second gap L2 is formed on the third organic layer 132 illustrated in FIG. 11B.

Figure 12A:
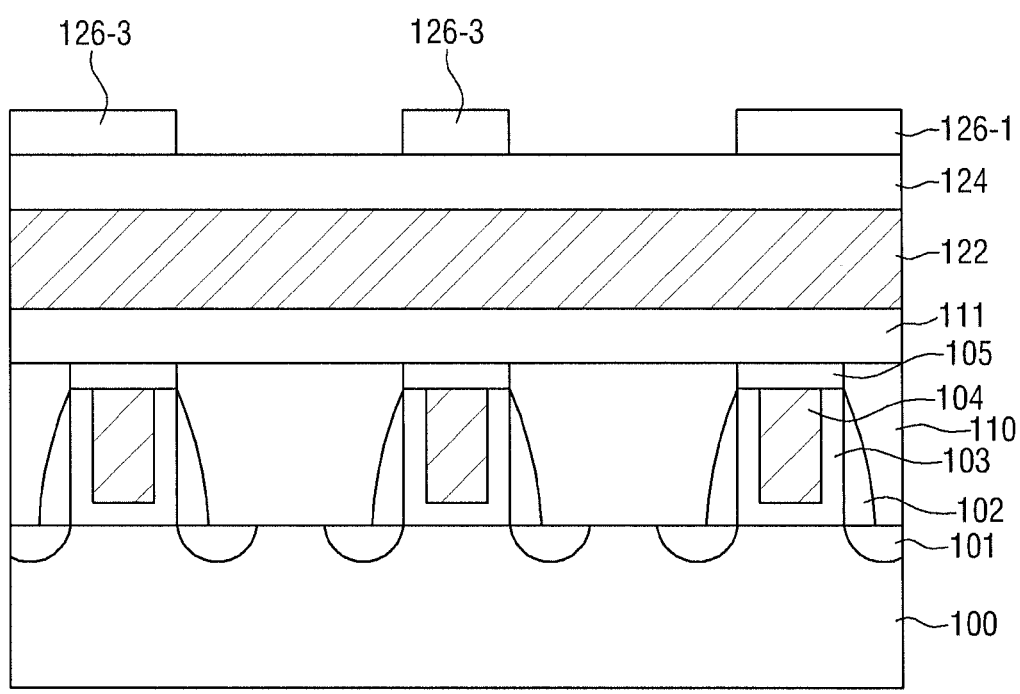
Figure 12B:
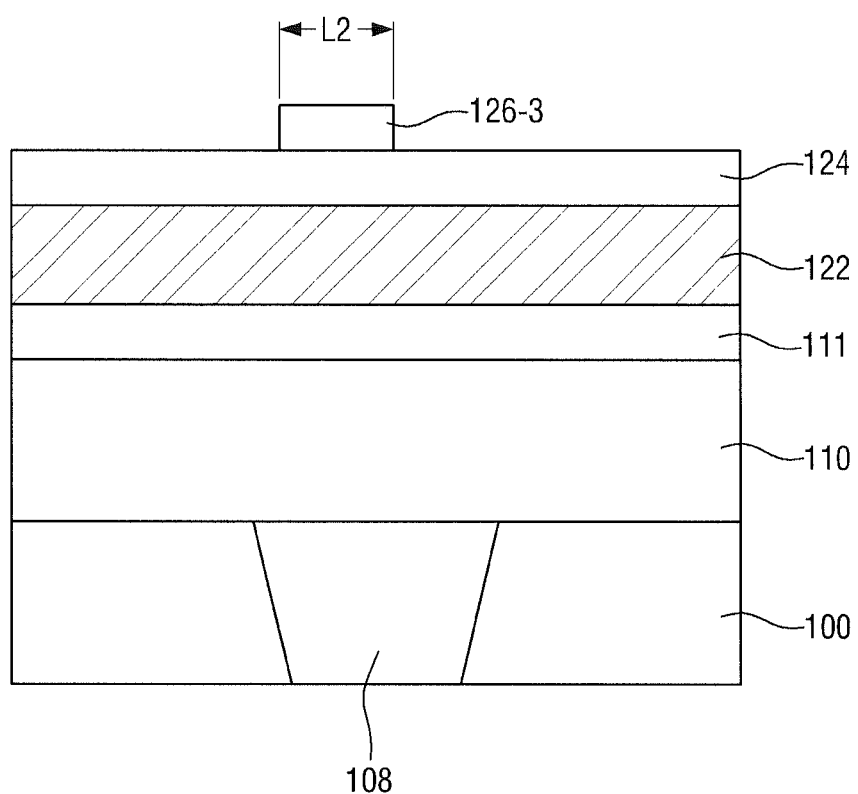
Figure 12C:
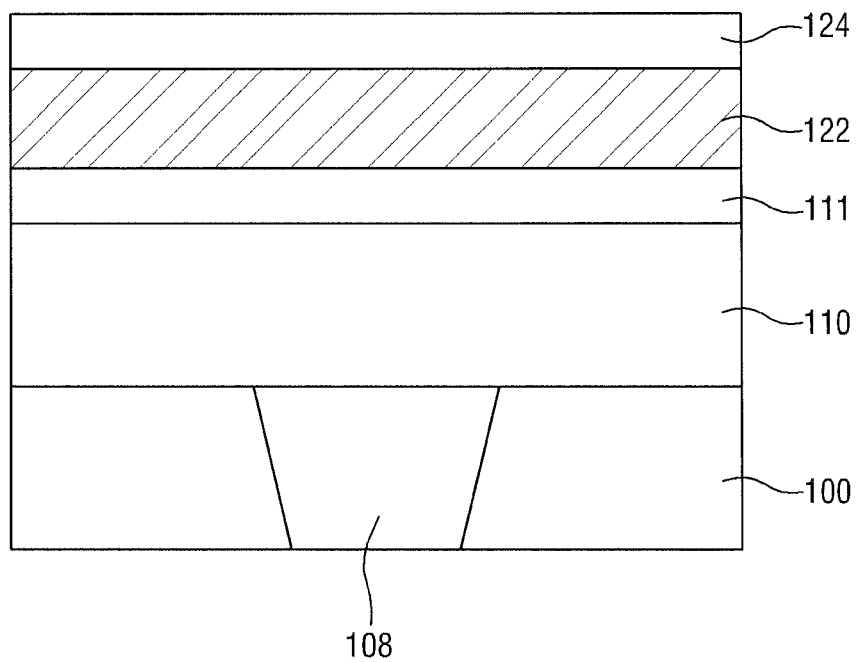

Referring to FIGS. 12A through 12C, the second hard mask layer pattern 126-2 and the third organic layer 132 are etched using the second photoresist pattern 134 as a mask. In this etching process, the oxide layer 124 may be used as an etch-stop layer. Thus, the second hard mask layer pattern 126-2 and the third organic layer 132 may be etched until the oxide layer 124 is exposed using the second photoresist pattern 134 as a mask. Then, the remaining second photoresist pattern 134 and the remaining third organic layer 132 are removed using an ashing process and/or a stripping process.

Accordingly, a third hard mask layer pattern 126-3 having a length equal to the second gap L2 is formed on the oxide layer 124 illustrated in FIG. 12B.

The third hard mask layer pattern 126-3 may correspond to the first mask MK1 (see FIG. 4) described above. Thus, the third hard mask layer pattern 126-3 may expose the regions in which the first sub-active contact pattern design AC1-1 (see FIG. 3) and the second sub-active contact pattern design AC1-2 (see FIG. 3) are defined.

Referring to FIG. 5, a third mask is formed (operation S340).

The third mask may correspond to the third mask MK3 (see FIG. 4) described above. This will now be described in greater detail with reference to FIGS. 13A through 13C.

Figure 13A:
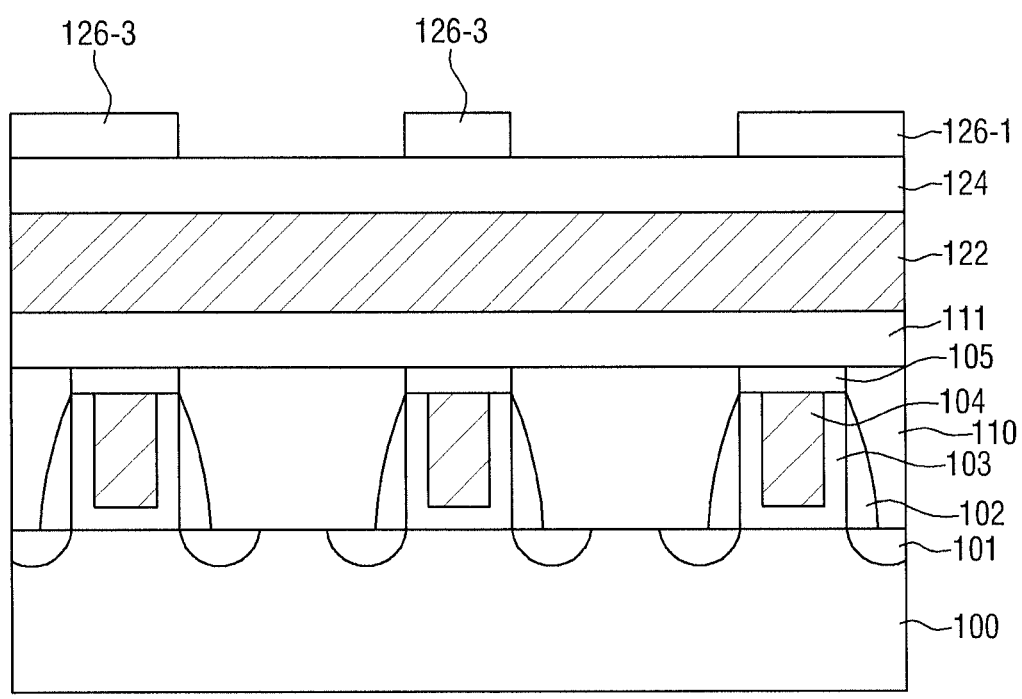
Figure 13B:
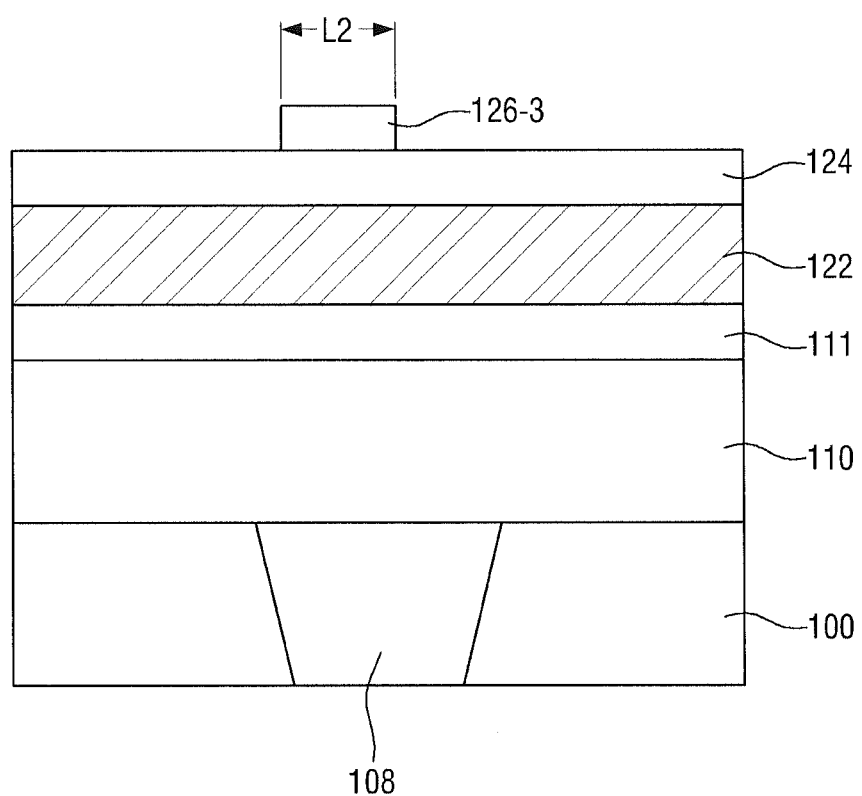

Referring to FIGS. 13A through 13C, a fourth organic layer 142 is formed on the oxide layer 124 and on the first hard mask layer pattern 126-1 and the third hard mask layer pattern 126-3. The fourth organic layer 142 may include, for example, an SOH layer.

A third photoresist pattern 144 is formed on the fourth organic layer 142 to expose the regions in which the third sub-active contact pattern design AC2-1 (see FIG. 3) and the fourth sub-active contact pattern design AC2-2 (see FIG. 3) are defined.

The fourth organic layer 142 is etched using the third photoresist pattern 144 as a mask. In this etching process, the oxide layer 124 may be used as an etch-stop layer. For example, the fourth organic layer 142 may be etched until the oxide layer 124 is exposed using the third photoresist pattern 144 as a mask.

Accordingly, the fourth organic layer 142 having a length equal to the first gap L1 is formed on the oxide layer 124 between portions of the hard mask layer 126, as illustrated in FIG. 13C.

The fourth organic layer 142 thus formed may correspond to the third mask MK3 (see FIG. 4) described above. Because the fourth organic layer 142 is formed in a region exposed by the first and second hard mask layer patterns 126-1 and 126-2, it may divide the region exposed by the first and second hard mask layer patterns 126-1 and 126-2 into a region corresponding to the third sub-active contact pattern design AC2-1 and a region corresponding to the fourth sub-active contact pattern design AC2-2 in FIG. 3.

Referring to FIG. 5, the target layer is etched (operation S350).

This will now be described in greater detail with reference to FIGS. 14A through 15C.

Figure 14A:
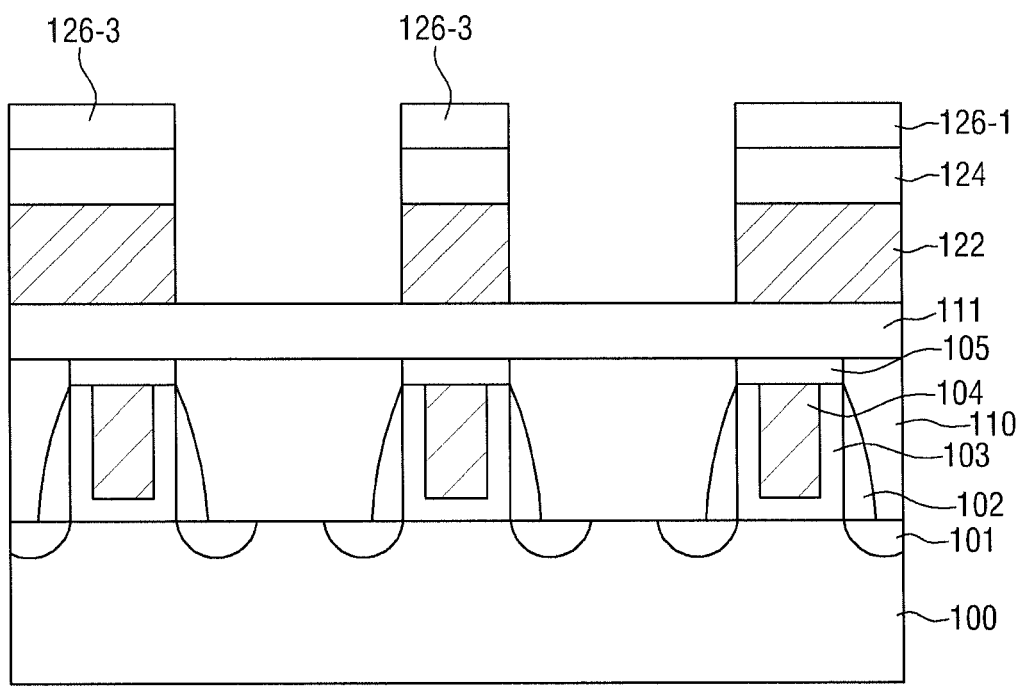
Figure 14B:
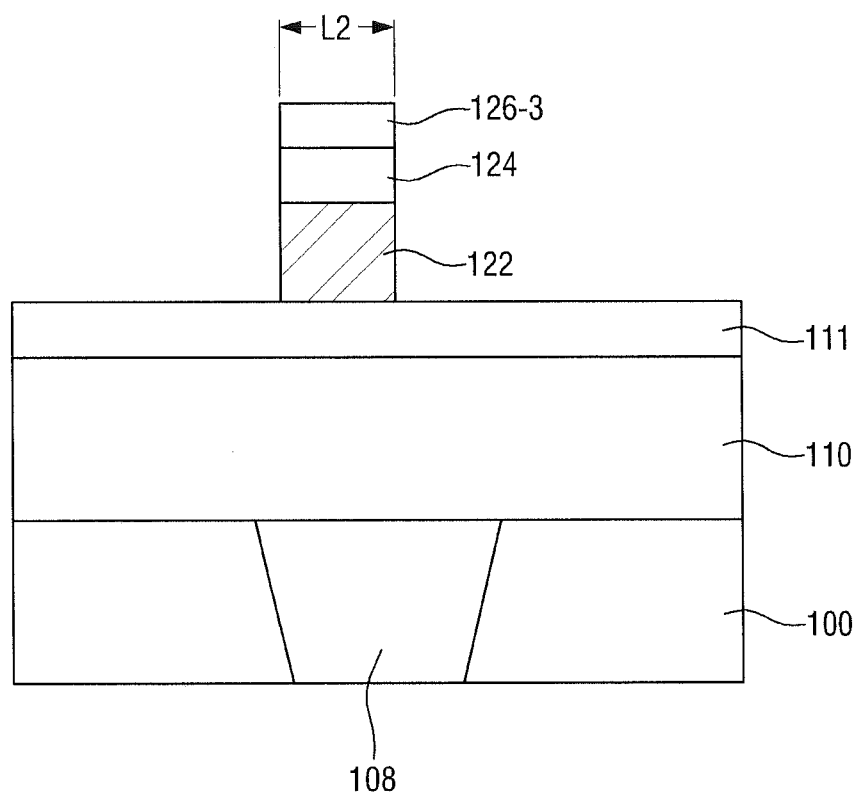
Figure 14C:
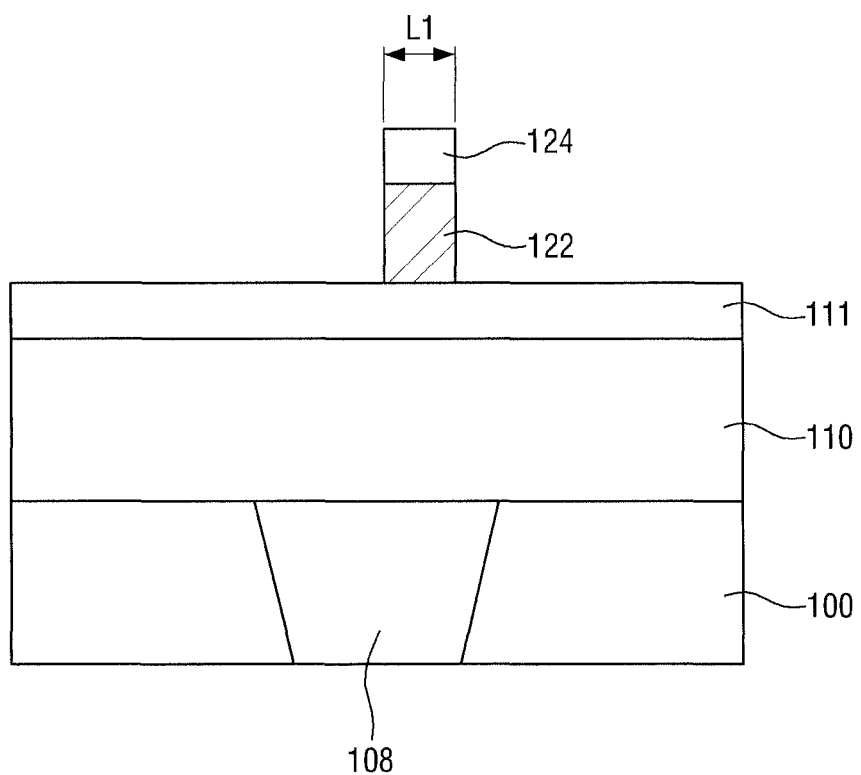

Referring to FIGS. 14A through 14C, the oxide layer 124 and the first organic layer 122 are etched using the first and third hard mask layer patterns 126-1 and 126-3 corresponding to the first and second masks MK1 and MK2 (see FIG. 4) and the fourth organic layer 142 corresponding to the third mask MK3 (see FIG. 4) as a mask. Accordingly, at least one of the first interlayer insulating film 110 and the second interlayer insulating film 111 included in the target layer may be exposed in the regions at which the first through fourth sub-active contact pattern designs AC1-1 through AC2-2 (see FIG. 3) are defined.

In the process of etching the first organic layer 122, the fourth organic layer 142 (see FIG. 13) may also be removed. Therefore, the fourth organic layer 142 (see FIG. 13) corresponding to the third mask MK3 (see FIG. 4) is not illustrated in FIG. 14C.

Figure 15A:
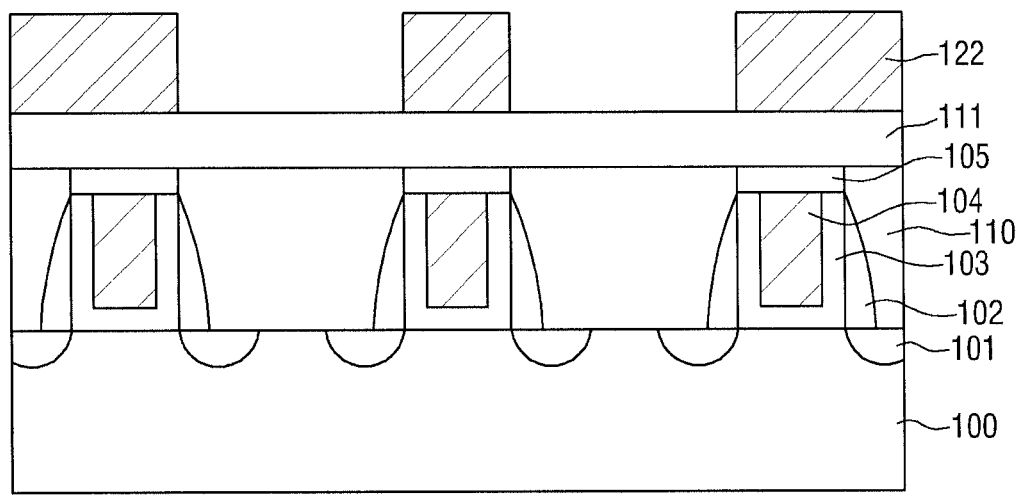
Figure 15B:
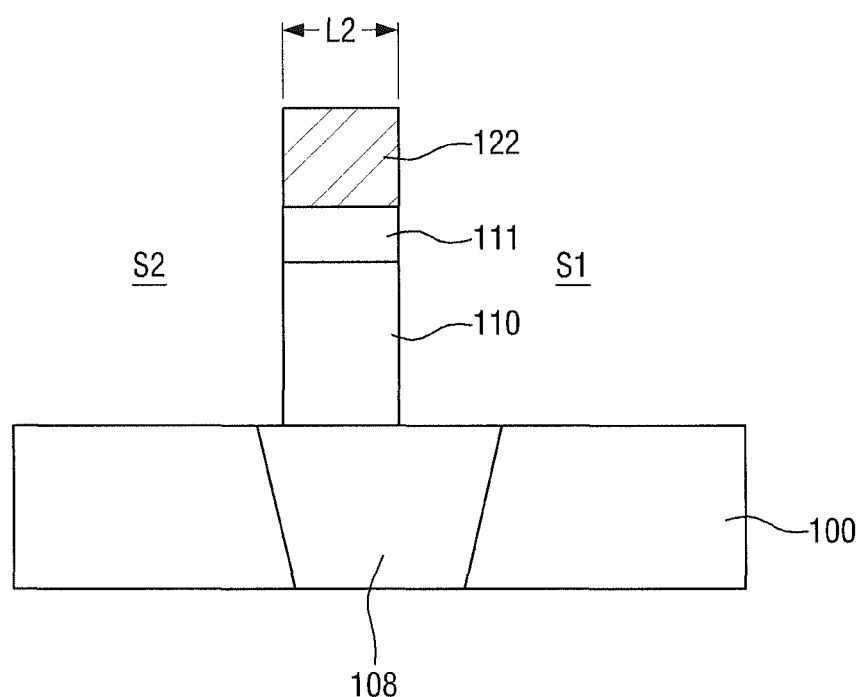
Figure 15C:
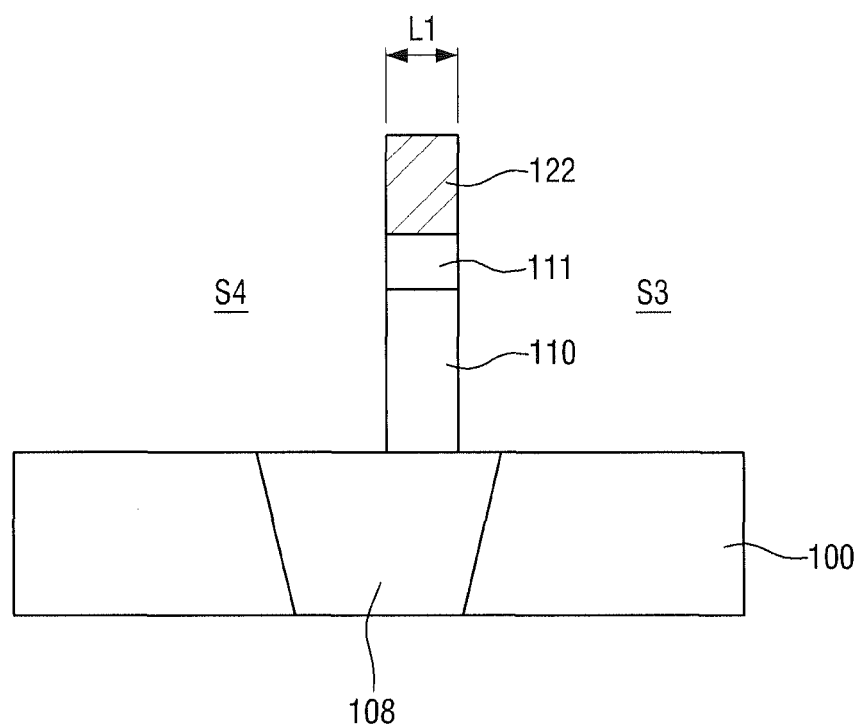

Referring to FIGS. 15A through 15C, the exposed first interlayer insulating film 110 and the exposed second interlayer insulating film 111 are etched such that the regions defined as the first through fourth sub-active contact pattern designs AC1-1 through AC2-2 (see FIG. 3) are defined in the target layer.

In some example embodiments of the inventive concepts, at least one of the first interlayer insulating film 110 and the second interlayer insulating film 111 may include, for example, an oxide layer. Thus, the oxide layer 124 (see FIG. 14A) formed on the first organic layer 122 can be removed in the process of removing the exposed first interlayer insulating film 110 and/or the exposed second interlayer insulating film 111.

The etching of the first interlayer insulating film 110 and the second interlayer insulating film 111 may expose the active patterns 100 in the regions defined as the first through fourth sub-active contact pattern designs AC1-1 through AC2-2 (see FIG. 3).

For example, the active pattern 100 in a region S1 (see FIG. 15B) may be exposed to define the first sub-active contact pattern design AC-1 (see FIG. 3), and the active pattern 110 in a region S2 (see FIG. 15B) may be exposed to define the second sub-active contact pattern design AC1-2 (see FIG. 3). The second sub-active contact pattern design AC1-2 may be separated from the first sub-active contact pattern design AC-1 by the second gap in the second direction Y.

Further, the active pattern 100 in a region S3 (see FIG. 15C) may be exposed to define the third sub-active contact pattern design AC2-1 (see FIG. 3) and the third sub-active contact pattern design AC2-1 may be separated from the first sub-active contact pattern design AC1-1 (see FIG. 3) in the first direction X. The active pattern 110 in a region S4 (see FIG. 15C) may be exposed to define the fourth sub-active contact pattern design AC2-2 (see FIG. 3). the fourth sub-active contact pattern design AC2-2 may be separated from the third sub-active contact pattern design AC2-1 (see FIG. 3) by the first gap L1 in the second direction Y.

Next, the remaining first organic layer 122 may be ashed. Accordingly, the first organic layer 122 remaining on at least one of the first interlayer insulating film 110 and the second interlayer insulating film 111 may be completely removed.

Referring to FIG. 5, a conductive layer is formed (operation S360).

This will now be described in greater detail with reference to FIGS. 16 through 17C.

Referring to FIGS. 16 through 17C, a conductive layer is formed to contact the exposed active patterns 110.

For example, the first sub-active contact pattern 151-1 may be formed by forming a conductive layer in the region corresponding to the first sub-active contact pattern design AC1-1 (see FIG. 3), and the second sub-active contact pattern 151-2 may be formed by forming a conductive layer in the region corresponding to the second sub-active contact pattern design AC1-2 (see FIG. 3).

Further, the third sub-active contact pattern 152-1 may be formed by forming a conductive layer in the region corresponding to the third sub-active contact pattern design AC2-1 (see FIG. 3), and the fourth sub-active contact pattern 152-2 may be formed by forming a conductive layer in the region corresponding to the fourth sub-active contact pattern design AC2-2 (see FIG. 3).

In some example embodiments of the inventive concepts, the first through fourth sub-active contact patterns 151-1 through 152-2 may be used to form, for example, self-aligned contacts, but example embodiments are not limited thereto.

Although not specifically illustrated in the drawings, vias (not illustrated) may be formed on the first through fourth sub-active contact patterns 151-1 through 152-2 in the regions in which the first through fourth via designs V1 through V4 (see FIG. 3) are defined. This completes the fabrication of a semiconductor device based on the layout design 10 of FIG. 3.

As apparent from the above description, in the method of fabricating a semiconductor device according to the current example embodiments, a first pattern and a second pattern are formed using double patterning lithography. Of the first pattern and the second pattern, a pattern (e.g., the region defined as the second active contact pattern design AC2 of FIG. 3) having sub-patterns having a gap smaller than a critical dimension at which patterning using double patterning lithography is possible is formed using a merge mask for forming the sub-patterns as a single pattern and a cut mask for dividing the single pattern. Therefore, fine pattern can be realized in a reliable manner.

A method of fabricating a semiconductor device according to another example embodiment of the inventive concepts will now be described with reference to FIGS. 18 and 19.

Figure 18:
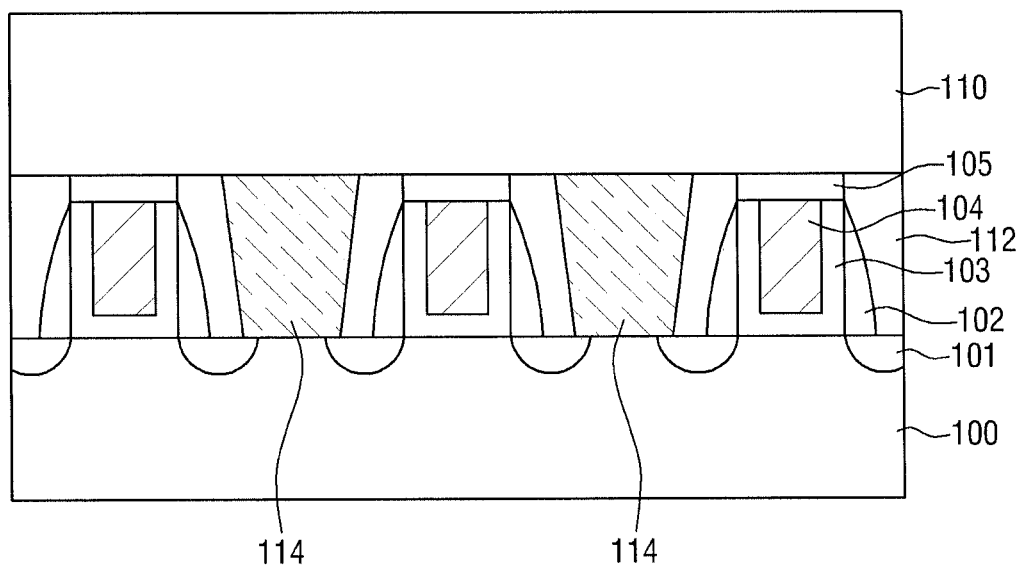
FIGS. 18 and 19 are views illustrating steps of a method of fabricating a semiconductor device according to another example embodiment of the present invention.
Figure 19:
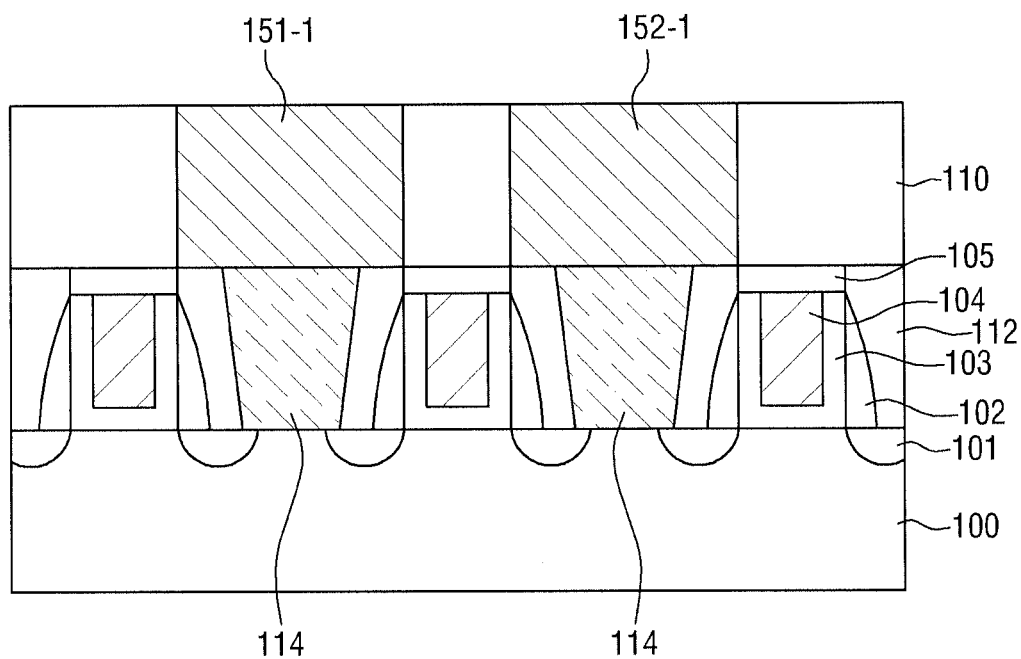

FIGS. 18 and 19 are views illustrating a method of fabricating a semiconductor device according to another example embodiment of the inventive concepts. The current example embodiment will hereinafter be described, focusing mainly on differences from the above-described embodiments.

The method of fabricating a semiconductor device according to the current example embodiment is different from the method according to the above-described example embodiment in the forming the target layer (operation S310 of FIG. 5) and the forming the conductive layer (operation S360 of FIG. 5).

Referring to FIG. 18, in the current example embodiment, a first interlayer insulating film 110 used as a target layer is not formed to directly cover an active pattern 100 but is formed on an insulating layer 112 that covers the active pattern 100.

For example, in the current example embodiment, the insulating layer 112 may be formed on the active pattern 100 to cover the active pattern 100, silicide contacts 114 may be formed between the insulating layer 112 to be electrically connected to the active pattern 100, and the first interlayer insulating film 110 used as the target layer may be formed on the insulating layer 112 and the silicide contacts 114.

Referring to FIG. 19, in the current example embodiment, conductive layers (e.g., a first sub-active contact pattern 151-1 and a second sub-active contact pattern 152-1) may be formed to contact the active pattern 100 via the silicide contacts 114.

Other components and features are the same as those of the above-described embodiments, and thus a redundant description thereof will be omitted.

Figure 20:
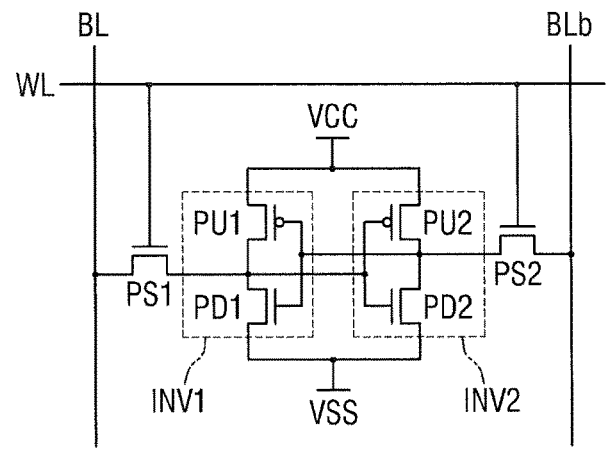
FIG. 20 is a circuit diagram of a semiconductor device according to an example embodiment of the present invention.
Figure 21:
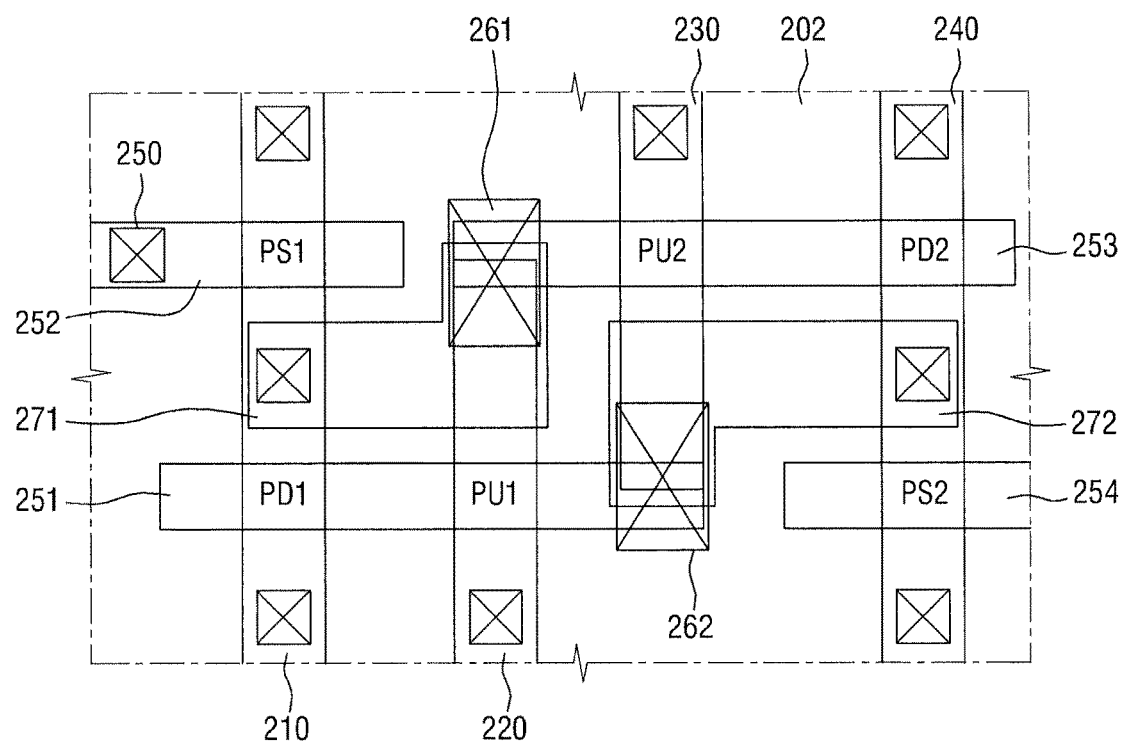
FIG. 21 is a layout diagram of the semiconductor device illustrated in FIG. 20.

FIG. 20 is a circuit diagram of a semiconductor device according to an example embodiment of the inventive concepts. FIG. 21 is a layout diagram of the semiconductor device illustrated in FIG. 20.

For simplicity, a redundant description of components identical to those of the above-described embodiments will be omitted, and the current example embodiment will hereinafter be described, focusing mainly on differences from the above-described embodiments.

Referring to FIGS. 20 and 21, a semiconductor device may include a pair of first and second inverters INV1 and INV2 connected in parallel between a power source node VCC and a ground node VSS and first and second pass transistors PS1 and PS2 respectively connected to output nodes of the first and second inverters INV1 and INV2. The first and second pass transistors PS1 and PS2 may be connected to a bit line BL and a complementary bit line BLb, respectively. Gates of the first and second pass transistors PS1 and PS2 may be connected to a word line WL.

The first inverter INV1 includes a first pull-up transistor PU1 and a first pull-down transistor PD1 connected in series, and the second inverter INV2 includes a second pull-up transistor PU2 and a second pull-down transistor PD2 connected in series. The first and second pull-up transistors PU1 and PU2 may be p-channel field effect transistors (PFETs), and the first and second pull-down transistors PD1 and PD2 may be n-channel field effect transistors (NFETs).

An input node of the first inverter INV1 is connected to the output node of the second inverter INV2, and an input node of the second inverter INV2 is connected to the output node of the first inverter INV1 so as for the first and second inverters INV1 and INV2 to form a single latch circuit.

Referring again to FIGS. 20 and 21, a first active fin 210, a second active fin 220, a third active fin 230 and a fourth active fin 240 may extend in a first direction (e.g., a vertical direction in FIG. 21) and may be separated from each other in a second direction. The second active fin 220 and the third active fin 230 may be shorter than the first active fin 210 and the fourth active fin 240.

Further, a first gate electrode 251, a second gate electrode 252, a third gate electrode 253, and a fourth gate electrode 254 may extend in second direction (e.g., a horizontal direction in FIG. 21) to intersect the first through fourth active fins 210 through 240.

For example, the first gate electrode 251 may completely intersect the first active fin 210 and the second active fin 220 and partially overlap an end of the third active fin 230. The third gate electrode 253 may completely intersect the fourth active fin 240 and the third active fin 230 and partially overlap an end of the second active fin 220. The second gate electrode 252 and the fourth gate electrode 254 may intersect the first active fin 210 and the fourth active fin 240, respectively.

The first pull-up transistor PU1 may be defined near the intersection of the first gate electrode 251 and the second active fin 220. The first pull-down transistor PD1 may be defined near the intersection of the first gate electrode 251 and the first active fin 210. The first pass transistor PS1 may be defined near the intersection of the second gate electrode 252 and the first active fin 210. The second pull-up transistor PU2 may be defined near the intersection of the third gate electrode 253 and the third active fin 230. The second pull-down transistor PD2 may be defined near the intersection of the third gate electrode 253 and the fourth active fin 240. The second pass transistor PS2 may be defined near the intersection of the fourth gate electrode 254 and the fourth active fin 240.

Although not specifically illustrated in the drawings, source and drain regions may be formed on both sides of each of the intersections between the first through fourth gate electrodes 251 through 254 and the first through fourth active fins 210 through 240, respectively. A plurality of contacts 250 may also be formed.

A first shared contact 261 may connect all of the second active fin 220, the third gate line 253, and wiring 271. A second shared contact 262 may connect all of the third active fin 230, the first gate line 251, and wiring 272. For example, if the shared contacts 261 and 262 or the wirings 271 and 272 include sub-patterns that are difficult to be patterned using double patterning lithography, the above-described methods of fabricating a semiconductor device can be applied in the process of fabricating the shared contacts 261 and 262 or the wirings 271 and 272.

Figure 22:
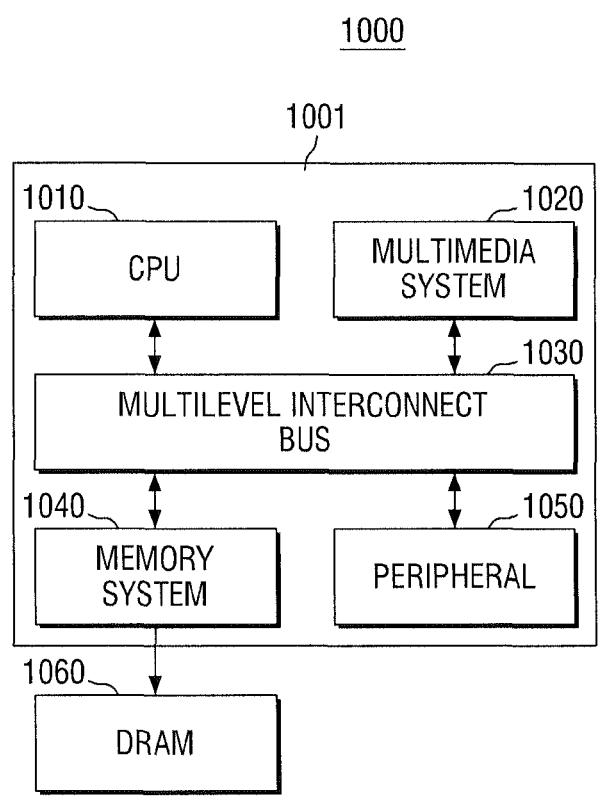
FIG. 22 is a block diagram of a system-on-chip (SoC) system including semiconductor devices according to an example embodiment of the present invention.

FIG. 22 is a block diagram of a system-on-chip (SoC) system including semiconductor devices according to an example embodiment of the inventive concepts.

Referring to FIG. 22, a SoC system 1000 includes an application processor 1001 and a dynamic random access memory (DRAM) 1060.

The application processor 1001 includes a central processing unit (CPU) 1010, a multimedia system 1020, a bus 1030, a memory system 1040, and a peripheral circuit 1050.

The CPU 1010 may be configured to drive the SoC system 1000. In some example embodiments of the inventive concepts, the CPU 1010 may be configured as a multi-core environment including a plurality of cores.

The multimedia system 1020 may be used to perform various multimedia functions in the SoC system 1000. The multimedia system 1020 may include, for example, a 3D engine module, a video codec, a display system, a camera system, and/or a post-processor.

The bus 1030 may be used for data communication among the CPU 1010, the multimedia system 1020, the memory system 1040 and the peripheral circuit 1050. In some example embodiment of the inventive concepts, the bus 1030 may have a multilayer structure. For example, the bus 1030 may be a multilayer advanced high-performance bus (AHB) or a multilayer advanced extensible interface (AXI).

The memory system 1040 may provide an environment needed for the application processor 1001 to be connected to an external memory (e.g., the DRAM 1060) and operate at high speed. In some example embodiment, the memory system 1040 may include a controller (e.g., a DRAM controller) for controlling the external memory (e.g., the DRAM 1060).

The peripheral circuit 1050 may provide the SoC system 1000 with an environment, which allows a smooth connection to an external device (e.g., mainboard). Accordingly, the peripheral circuit 1050 may include various interfaces that enable the external device connected to the SoC system 1000 to be compatible with the SoC system 1000.

The DRAM 1060 may function as an operating memory for the application processor 1001. In some example embodiments, the DRAM 1060 may be placed outside the application processor 1001 as illustrated in the drawing. For example, the DRAM 1060 may be packaged with the application processor 1001 in the form of package on package (PoP).

At least one of the components of the SoC system 1000 may include a semiconductor device according to the above-described example embodiments of the inventive concepts or may be fabricated using a method of fabricating a semiconductor device according to the above-described example embodiments of the inventive concepts.

Figure 23:
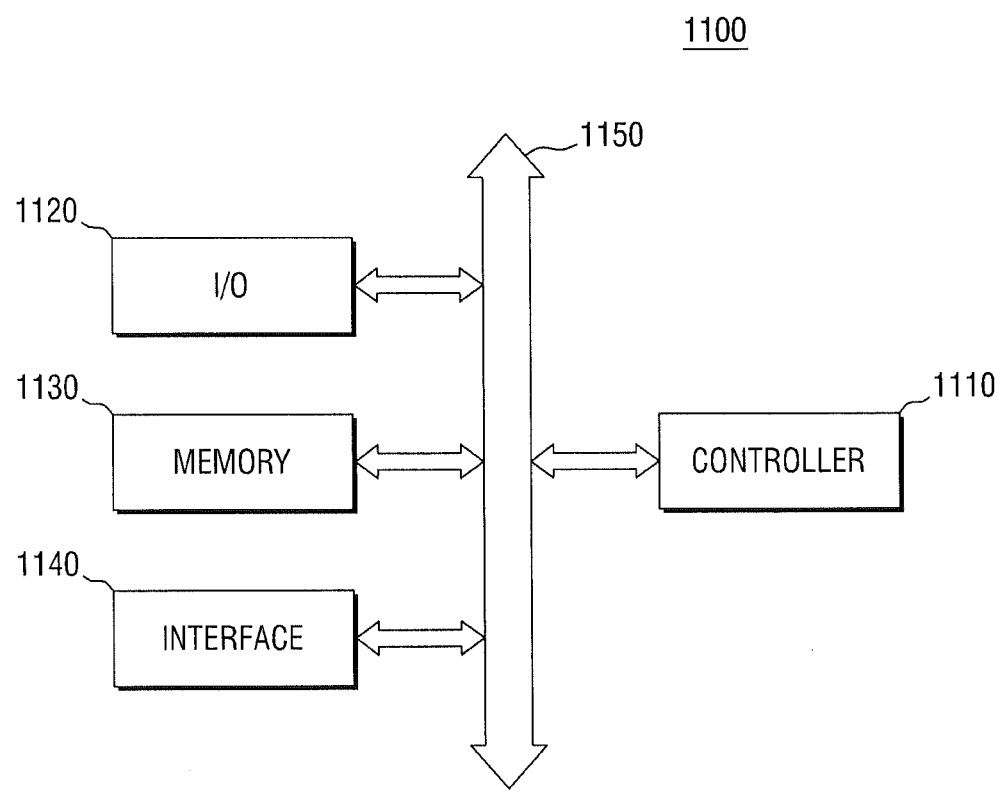
FIG. 23 is a block diagram of an electronic system including a semiconductor devices according to an example embodiment of the present invention.

FIG. 23 is a block diagram of an electronic system including semiconductor devices according to an example embodiment of the inventive concepts.

Referring to FIG. 23, an electronic system 1100 includes a controller 1110, an input/output (I/O) device 1120, a memory device 1130, an interface 1140 and a bus 1150. The controller 1110, the I/O device 1120, the memory device 1130 and/or the interface 1140 may be connected to one another by the bus 1150. The bus 1150 may serve as a path for transmitting data.

The controller 1110 may include at least one of a microprocessor, a digital signal processor, a microcontroller and logic devices capable of performing similar functions to those of a microprocessor, a digital signal processor and a microcontroller. The I/O device 1120 may include, for example, a keypad, a keyboard and a display device. The memory device 1130 may store data and/or commands. The interface 1140 may be used to transmit data to or receive data from a communication network. The interface 1140 may be a wired or wireless interface. In an example, the interface 1140 may include an antenna or a wired or wireless transceiver.

Although not illustrated in the drawing, the electronic system 1100 may be an operating memory for improving the operation of the controller 1110, and may further include a high-speed DRAM or SRAM. Here, any one of the semiconductor devices according to the above-described example embodiments of the inventive concepts may be employed as the operating memory. Further, any one of the semiconductor devices according to the above-described example embodiments may be provided in the memory device 1130, in the controller 1110, or in the I/O device 1120.

The electronic system 1100 may be applied to nearly all types of electronic products capable of transmitting or receiving information in a wireless environment, for example, a personal data assistant (PDA), a portable computer, a web tablet, a wireless phone, a mobile phone, a digital music player, or a memory card.

Figure 24:
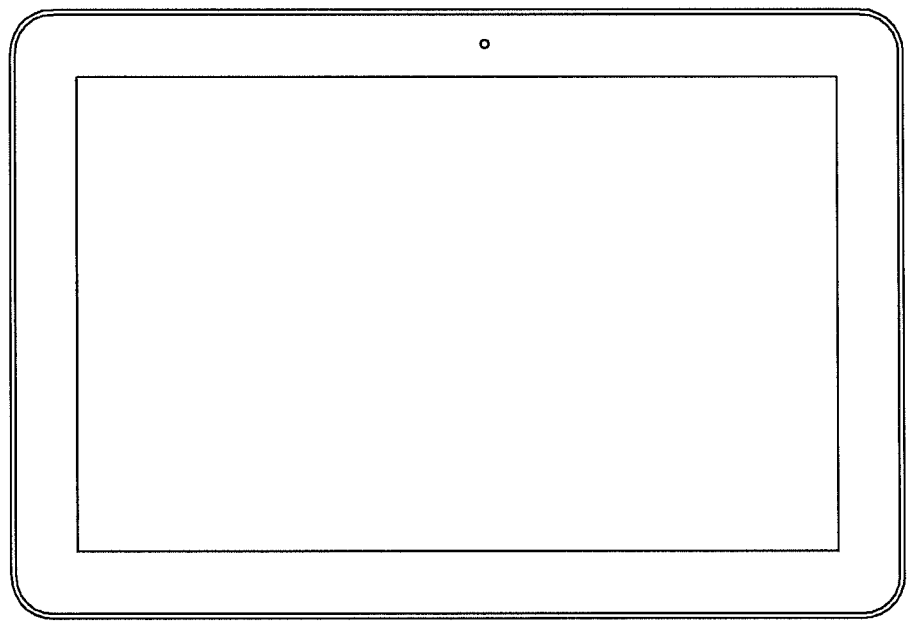
FIGS. 24 through 26 are diagrams illustrating examples of a semiconductor system to which semiconductor devices according to an example embodiment of the present invention can be applied.
Figure 25:
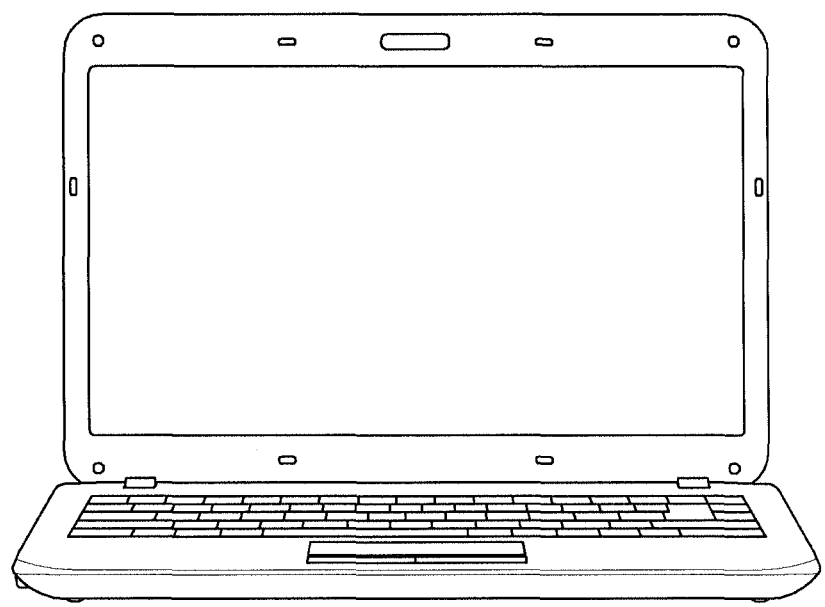
Figure 26:
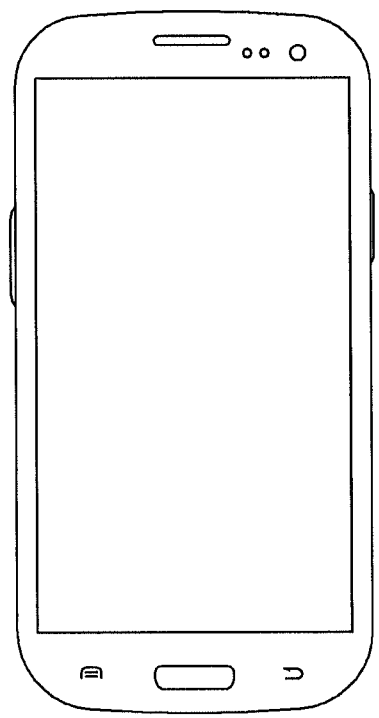

FIGS. 24 through 26 are diagrams illustrating examples of a semiconductor system to which semiconductor devices according to an example embodiment of the inventive concepts can be applied.

FIG. 24 illustrates a tablet personal computer (PC) 1200, FIG. 25 illustrates a laptop computer 1300, and FIG. 26 illustrates a smartphone 1400. At least one of the semiconductor devices according to the above-described example embodiments of the inventive concepts may be used in the tablet PC 1200, the notebook computer 1300, and the smartphone 1400.

The semiconductor devices according to the example embodiments of the inventive concepts, as set forth herein, may also be applied to various IC devices other than those set forth herein. While the tablet PC 1200, the notebook computer 1300, and the smartphone 1400 have been described above as examples of a semiconductor system according to some example embodiments of the inventive concepts, the examples of the semiconductor system according to example embodiment are not limited to the tablet PC 1200, the notebook computer 1300, and the smartphone 1400. In some example embodiments of the inventive concepts, the semiconductor system may be provided as a computer, an Ultra Mobile PC (UMPC), a work station, a net-book computer, a PDA, a portable computer, a wireless phone, a mobile phone, an e-book, a portable multimedia player (PMP), a portable game console, a navigation device, a black box, a digital camera, a 3-dimensional television set, a digital audio recorder, a digital audio player, a digital picture recorder, a digital picture player, a digital video recorder, a digital video player, etc.

In concluding the detailed description, those skilled in the art will appreciate that many variations and modifications can be made to the above-mentioned example embodiments without substantially departing from the principles of example embodiment. Therefore, the disclosed example embodiments of the invention are used in a generic and descriptive sense only and not for purposes of limitation.

What is claimed is:

1. A method of fabricating a semiconductor device, the method comprising:
    forming a target layer;
    forming a first mask on the target layer to expose a first region;
    subsequently forming a second mask on the target layer to expose a second region separated from the first region in a first direction;
    subsequently forming a third mask in the exposed first region to divide the first region into a first sub region and a second sub region separated from each other in a second direction intersecting the first direction; and
    etching the target layer using the first through third masks such that the first and second sub regions and the second region are defined in the target layer.

2. The method of claim 1, wherein the target layer comprises an oxide layer.

3. The method of claim 1, wherein the forming of the first mask comprises:
    sequentially forming a first organic layer, an oxide layer, and a hard mask layer on the target layer; and
    patterning the hard mask layer using the oxide layer as an etch-stop layer.

4. The method of claim 3, wherein the oxide layer comprises a same material as the target layer.

5. The method of claim 3, wherein the patterning of the hard mask layer comprises:
    sequentially forming a second organic layer and a photoresist pattern on the hard mask layer; and
    etching, using the photoresist pattern, the second organic layer and the hard mask layer until the oxide layer is exposed.

6. The method of claim 3, wherein the forming a third mask comprises:
    forming a second organic layer and a photoresist pattern on the oxide layer; and
    patterning the second organic layer using the photoresist pattern as a mask and using the oxide layer as an etch-stop layer.

7. The method of claim 6, wherein the etching the target layer such that the first and second sub regions are defined in the target layer comprises:
    exposing the target layer by etching the oxide layer and the first organic layer using the first and third masks; and
    etching the exposed target layer and the oxide layer together.

8. The method of claim 7, further comprising:
    ashing the first organic layer.

9. The method of claim 1, further comprising:
    forming a conductive layer to contact an active pattern underlying the target layer in the first and second sub regions and the second region.

10. The method of claim 9, wherein the active pattern comprises an active fin extending along the first direction, and the forming a target layer further comprises forming a gate electrode on the active fin to extend along the second direction.

11. The method of claim 1, further comprising:
    forming a conductive layer in the first and second sub regions and the second region, and
    wherein the forming a target layer includes,
    forming an active pattern;
    forming a silicide contact on the active pattern to contact the conductive layer; and
    forming the target layer on the silicide contact.

12. A method of fabricating a semiconductor device, the method comprising:
    receiving a layout design in which first and second patterns formed using double patterning lithography are defined, the first pattern including a first sub pattern and a second sub pattern separated from the first sub pattern by a first gap;
    generating a first mask for exposing regions defined as the first and second sub patterns and a region between the first and second sub patterns;
    generating a second mask for exposing a region defined as the second pattern; and
    generating a third mask for dividing a region exposed by the first mask into the regions defined as the first and second sub patterns, wherein in the layout design, a region defined as the first pattern and the region defined as the second pattern are separated from each other in a first direction, and the region defined as the first sub pattern and the region defined as the second sub pattern are separated from each other in a second direction intersecting the first direction.

13. The method of claim 12, wherein a first active contact pattern is formed on an active pattern in the region defined as the first pattern, and a second active contact pattern is formed on the active pattern in the region defined as the second pattern.

14. The method of claim 12, wherein the second pattern comprises a third sub pattern and a fourth sub pattern separated from the third sub pattern by a second gap greater than the first gap.

15. The method of claim 14, wherein the first gap is equal to or smaller than a critical dimension of the double patterning lithography, and the second gap is greater than the critical value.

16. A method of forming patterns separated by a gap smaller than a critical dimension, the method comprising:
   forming a target layer;
   forming an insulating layer over the target layer;
   forming a first mask on the insulating layer to expose a first region extending in a first direction;
   forming a second mask to cover a second region, the second region being a region separating the first region into two sub-regions in a second direction intersecting the first direction;
   etching, using the first and second masks, the target layer to form two openings therein such that the two openings are separated by a gap corresponding to the second region, extend in the first direction, and expose underlying conductive members therethrough; and
   forming conductive patterns confined by the two openings such that the conductive patterns physically contact the underlying conductive members.

17. The method of claim 16, wherein the forming an insulating layer comprises:
   sequentially forming a first organic layer, an oxide layer, and a first hard mask layer on the target layer.

18. The method of claim 17, wherein the forming a first mask comprises:
   sequentially forming a second organic layer and a first photoresist pattern on the first hard mask layer; and
   etching the second organic layer and the first hard mask layer until the oxide layer is exposed.

19. The method of claim 18, wherein the forming a second mask comprises:
   selectively removing the first hard mask layer in the first region;
   sequentially forming a third organic layer and a second photoresist pattern on the oxide layer; and
   patterning the second organic layer using the second photoresist pattern as a mask and using the oxide layer as an etch-stop layer.

* * * * *